United States Patent [19]
Allred

[11] Patent Number: 5,734,798
[45] Date of Patent: Mar. 31, 1998

[54] METHOD AND APPARATUS FOR EXTRACTING A GATE MODELED CIRCUIT FROM A FET MODELED CIRCUIT

[75] Inventor: Daryl Allred, Ft. Collins, Colo.

[73] Assignee: Hewlett-Packard Co., Palo Alto, Calif.

[21] Appl. No.: 566,233

[22] Filed: Dec. 1, 1995

[51] Int. Cl.$^6$ .................................................. G06F 17/00
[52] U.S. Cl. .............................. 395/50; 364/488; 364/489; 395/921
[58] Field of Search ........................ 364/488, 489, 364/490, 491; 395/50, 919, 921

[56] References Cited

U.S. PATENT DOCUMENTS

| | | | |
|---|---|---|---|
| 4,792,909 | 12/1988 | Serlet | 364/491 |
| 4,815,003 | 3/1989 | Putatunda | 364/491 |
| 4,831,543 | 5/1989 | Mastellone | 364/489 |
| 5,043,914 | 8/1991 | Nishiyama | 395/51 |
| 5,084,824 | 1/1992 | Lam | 364/488 |
| 5,243,538 | 9/1993 | Okuzawa | 364/489 |
| 5,331,568 | 7/1994 | Pixley | 364/489 |
| 5,383,167 | 1/1995 | Weil | 364/488 |
| 5,461,574 | 10/1995 | Matsunaga | 364/489 |
| 5,471,398 | 11/1995 | Stephens | 364/490 |
| 5,477,474 | 12/1995 | Southgate | 364/489 |
| 5,493,504 | 2/1996 | Minato | 364/488 |
| 5,528,508 | 6/1996 | Russel | 364/488 |

*Primary Examiner*—Robert W. Downs
*Assistant Examiner*—Jeffrey S. Smith

[57] ABSTRACT

A method of extracting a gate model from a fet model using a computer implemented expert system apparatus to perform the steps of recognizing power, ground and clock signals; recognizing inverters; recognizing and preserving all logic signals of the fet modeled circuit; building one or more structurally based boolean partial trees for each of the recognized logic signals; heuristically pruning the one or more boolean trees; and building logic equations from the one or more boolean partial trees. The expert system apparatus comprises a fet modeled input netlist, an inference engine, a rule base, a user input, and a gate modeled output netlist.

20 Claims, 24 Drawing Sheets

MASTER       SLAVE

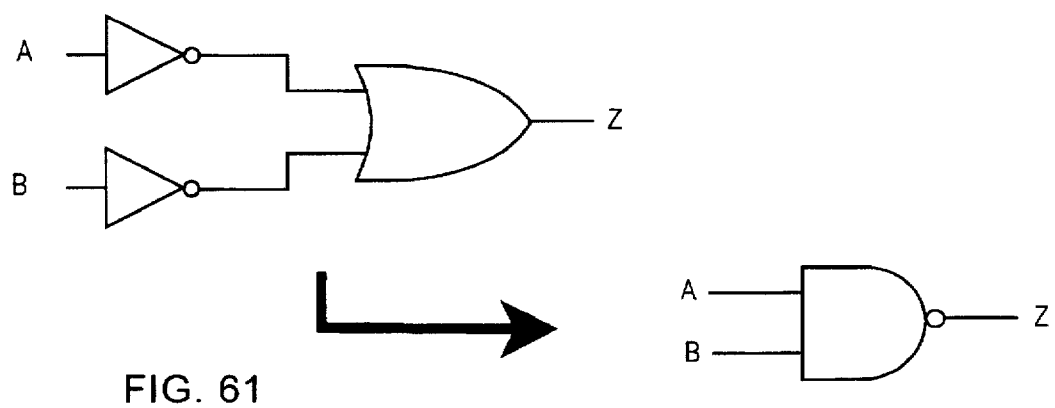
FIG. 61
FIG. 64
FIG. 65
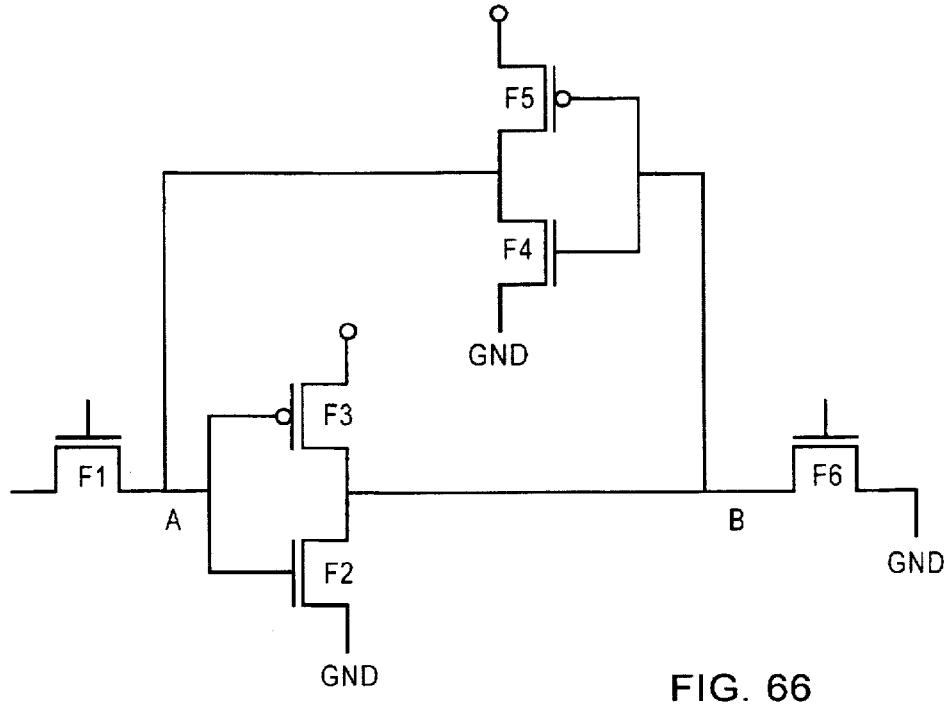
FIG. 66

METHOD AND APPARATUS FOR EXTRACTING A GATE MODELED CIRCUIT FROM A FET MODELED CIRCUIT

BACKGROUND OF THE INVENTION

This invention pertains to a method and apparatus for extracting a gate modeled circuit from a fet modeled circuit, and more specifically, to a method and apparatus for extracting a gate modeled circuit which retains a structural correspondence with the fet modeled circuit.

Although integrated circuits (ICs) are designed and built with field effect transistors (fets), many tools require a gate-level model of an IC (or at least a model with a very limited number of fets). While a fet model of an IC comprises fets, wires and other structural elements (non-fet instances), a gate model is a functional abstraction of an IC comprising interconnected logic gates (and possibly a limited number of fets). Extracting a gate model from a fet model is a process which is time consuming and error prone. Therefore, some designers have attempted to automate the process using computers.

One method of extracting a gate model is through the use of exhaustive vectors. An exhaustive vector set is derived from the circuit's inputs and run through a fet-level simulator. Each vector produces a set of expected outputs from which a gate model can be synthesized. The disadvantages of such a method include 1) a circuit with more than about 14 inputs requires so many vectors that the equations are simply unmanageable, and 2) circuits with state elements (storage or feedback) can't be adequately characterized by exhaustive vectors. This is because they require additional vectors for each state, and current methods for deriving the additional vectors are cumbersome and ineffective.

Another disadvantage of the exhaustive vector method of gate modeling is that the resultant gate model bears no structural similarity to the input fet model. As a consequence, the resultant gate model retains a circuits' inputs and outputs, but between the inputs and outputs bears no resemblance to the structure of the fet model. Thus, when a tool reveals an error in the gate modeled circuit, it can be extremely difficult to debug the fet modeled circuit.

Another method of extracting a gate model comprises remodeling transforms based on recognition of simple circuits. This solution attempts to replace fet structures with complementary CMOS structures, and precharge circuits with gates. However, this method is limited to the recognition of only a few simple circuit types. In a complex IC, such as a CPU (central processing unit), or an ASIC (application specific integrated circuit), too many "exceptions to the rule" exist, and simple circuit recognition is no longer feasible. Although simple circuit recognition helps to retain the structural characteristics of a fet model, it just isn't practical for use with large IC schematics.

It is therefore a primary object of this invention to provide a method and apparatus for extracting a gate modeled circuit from a fet modeled circuit while retaining a structural correspondence between the two models.

It is an additional object of this invention to provide a method and apparatus which significantly reduce the time required to extract a gate modeled circuit.

It is also an object of this invention to provide a method and apparatus which are accurate and verifiable.

It is yet another object of this invention to provide a method and apparatus which can be used to decouple the designer from the majority of the extraction process.

SUMMARY OF THE INVENTION

In the achievement of the foregoing objects, the inventor has devised a computer implemented method and apparatus for extracting a gate modeled circuit from a fet modeled circuit.

The method is carried out by a computer programmed as an "expert system". An expert system is one which attempts to combine the typical algorithmic approach (execution of a sequence of instructions leading to a solution) of a computer with a knowledge based approach that would normally be provided by a human expert.

Expert systems in general comprise three parts: a knowledge base, an inference engine and a user interface. The knowledge base comprises rules, facts and heuristics which would typically be supplied by a human expert. The knowledge base is used by the inference engine to infer (derive) new facts (learn). When the inferencing engine is unable to infer a required fact from the knowledge base, the system's user is prompted to supply the missing information.

To assist in a complete understanding of how the disclosed method and apparatus (the expert system) works, a brief summary of the expert system, and Prolog (the computer language in which the disclosed system was implemented) will follow. One skilled in the art should already have some familiarity with these areas.

The knowledge base of an expert system comprises numerous rule groups (or classes). In Prolog terms, a rule group may be declared by the statement:

inference_control (Name, Type, Control)

where Name is the name of the rule group, Type is the inferencing type, and Control is a structure containing the list of rules. Rule inferencing types include sequential (basic_engine), forward chaining (forward_engine), and backward chaining (backward_engine).

When a sequential rule group is opened, its rules fire one at a time in the order designated within the rule group. The rules of a forward chaining rule group become active when the group is opened or started, and can fire at any time (in any order, triggered only by the successful matching of the conditions within the rule itself) until the rule group is closed. Backward chaining rule groups remain active at all times. However, backward chain rules are demand driven, and therefore only fire when requested to do so. Backward chain rules are used to control computations which could otherwise "blow up" and waste valuable computer processing time.

All Prolog rules follow a basic format. The format is:

rule Name if Conditions then Actions [because Notes]

A sample Prolog rule might appear as follows:

| | |
|---|---|
| rule | 'Power Connected Fet' |
| if | database instance_type(Fet,_,_) and |
| | not database redundant_fet(Fet) and |
| | fet_source_drain_signals(Fet, VDD, Sig) and |
| | database power(VDD,_) |
| then | assert signal_driven_to_power(Sig,Fet) |
| because | ['This signal is connected to power via a fet.'], |

Conditions are one or more clauses separated by the conjunction 'and' or the disjunctive 'or'. A condition clause can either access the expert system's database, or can invoke a user-defined predicate. Backward chaining rule queries can be made via a "?" operator appearing in the conditions. Rule conditions are commonly referred to as the left-hand side (LHS) of a rule.

Following the rule conditions is a consequence or action (also referred to as the right-hand side (RHS) of a rule). The RHS of a sequential or forward chain rule is one or more actions which can assert information into the expert system's database (in the following description, the database is a gate model database), retract information out of the database, or perform any other user-defined function. The RHS of a backward chain rule is a single term defining the result of a backward chaining query.

The because clause is optional and does not enter into the operation of the expert system. It is used for documentation concerning the function of a rule.

For example, the above rule, 'Power Connected Fet', functions as follows. For each instance in the database (instance_type/3) that is not marked as redundant in the database and whose source/drain (Prolog predicate fet_source_drain_signals/3) is connected to a designated power signal, then an entry is asserted (added) into the Prolog database of "signal_driven_to_power(Sig,Fet)" where the variable Fet is the instance name of the fet, and Sig is the signal name of the fet opposite the power signal.

Steps in the method and apparatus comprising the expert system disclosed herein include recognizing power, ground and clock signals; recognizing inverters; recognizing and preserving all logic signals contained in the fet modeled circuit; building one or more structurally based boolean partial trees for each of the recognized logic signals; heuristically pruning the one or more boolean partial trees; and building logic equations from the one or more boolean partial trees.

This method recognizes the importance of logic signals and the use of structurally based boolean trees in retaining structural integrity in an extracted gate model. A structurally based boolean tree is a new concept which will be disclosed in the following description. Partial trees assist in simplifying logic equations and abstracting a gate model to a higher level. Previous gate model extraction tools have not been able to accomplish these tasks on a large scale.

Due to the creation of the structurally based boolean partial trees (wherein a branch of a partial tree represents a fet), the gate model produced by the above method has a structural correspondence with its fet model, making the fet model much easier to debug when a testing tool notes an error in the gate model.

By stepping through much of the reasoning process previously left to humans, the invention significantly reduces the time required to extract a gate modeled circuit. Yet, the expert system method and apparatus are conservative, only inferring a fet direction, port direction, or circuit function when it is reasonably certain.

When a fet direction, port direction, or circuit function is somewhat ambiguous, the expert system will prompt the user to select between alternatives so as to produce the most correct and efficient model. It is believed, however, that the disclosed method can extract most gate models with only a small percentage of user prompts.

These and other important advantages and objectives of the present invention will be further explained in, or will become apparent from, the accompanying description, drawing and claims.

BRIEF DESCRIPTION OF THE DRAWING

An illustrative and presently preferred embodiment of the invention is illustrated in the drawing in which:

FIG. 61 shows a second gate optimization process;

FIG. 64 shows a first pair of fet implemented capacitors;

FIG. 65 shows a second pair of fet implemented capacitors; and

FIG. 66 is another schematic showing 2-way feedback.

DESCRIPTION OF THE PREFERRED EMBODIMENT

Figure 1:
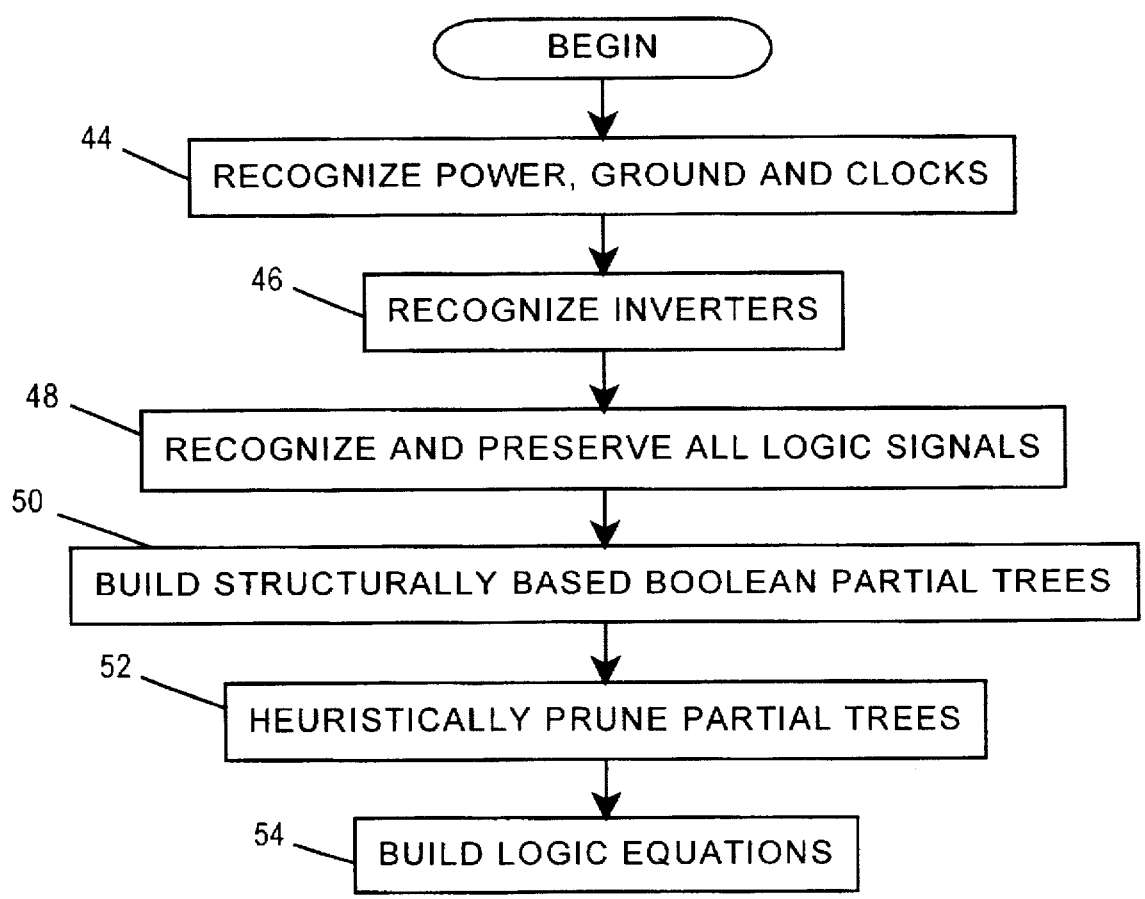
FIG. 1 is a flow chart of a method for extracting a gate model from a fet model.

A computer implemented method of extracting a gate modeled circuit from a fet modeled circuit is described below and shown generally in FIG. 1. The method may comprise the steps of recognizing power, ground and clock signals 44; recognizing inverters 46; recognizing and preserving all logic signals in the fet modeled circuit 48; building one or more structurally based boolean partial trees for each of the recognized logic signals 50; heuristically pruning the one or more boolean partial trees 52; and building logic equations from each of the one or more boolean partial trees 54.

Figure 34:
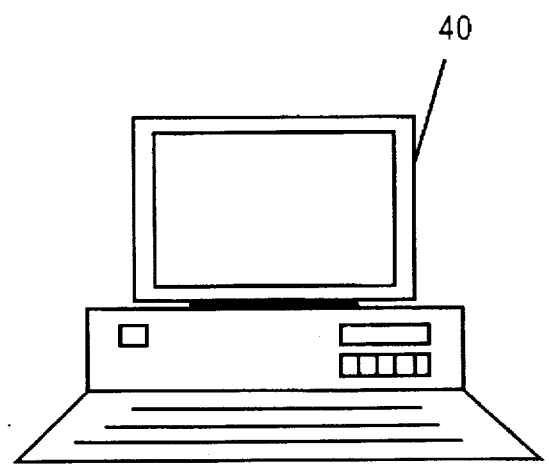
FIG. 34 shows a computer in which the method of FIGS. 1 or 2 may be implemented.
Figure 35:
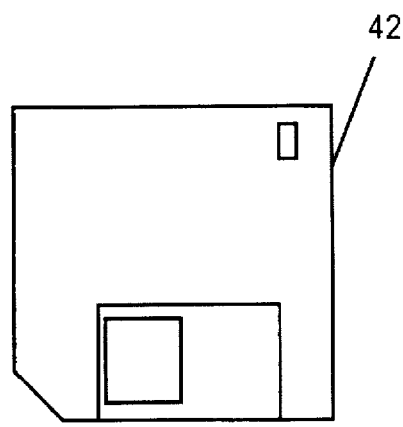
FIG. 35 shows a physical storage media capable of programming the computer of FIG. 34 to implement the method of FIGS. 1 or 2.

The method is preferably implemented by an expert system stored in a programmable computer 40 (or in a physical storage media 42 capable of programming a computer 40), wherein the expert system may generally comprise a fet modeled circuit input, an inference engine, a rule base, a user input, and a gate modeled circuit output. See FIGS. 34 and 35. The inference engine uses the fet modeled circuit input (in the form of an input netlist) in processing the rules and inferring a gate-level model (in the form of an output netlist).

Having thus described the method and apparatus in general, they will now be described in further detail. The method and apparatus disclosed herein were developed using the Prolog computer programming language. However, use of a particular programming language is not a prerequisite to using the method and apparatus disclosed, and one skilled in the art may choose to implement the disclosed method and apparatus using a different programming language.

Figure 2:
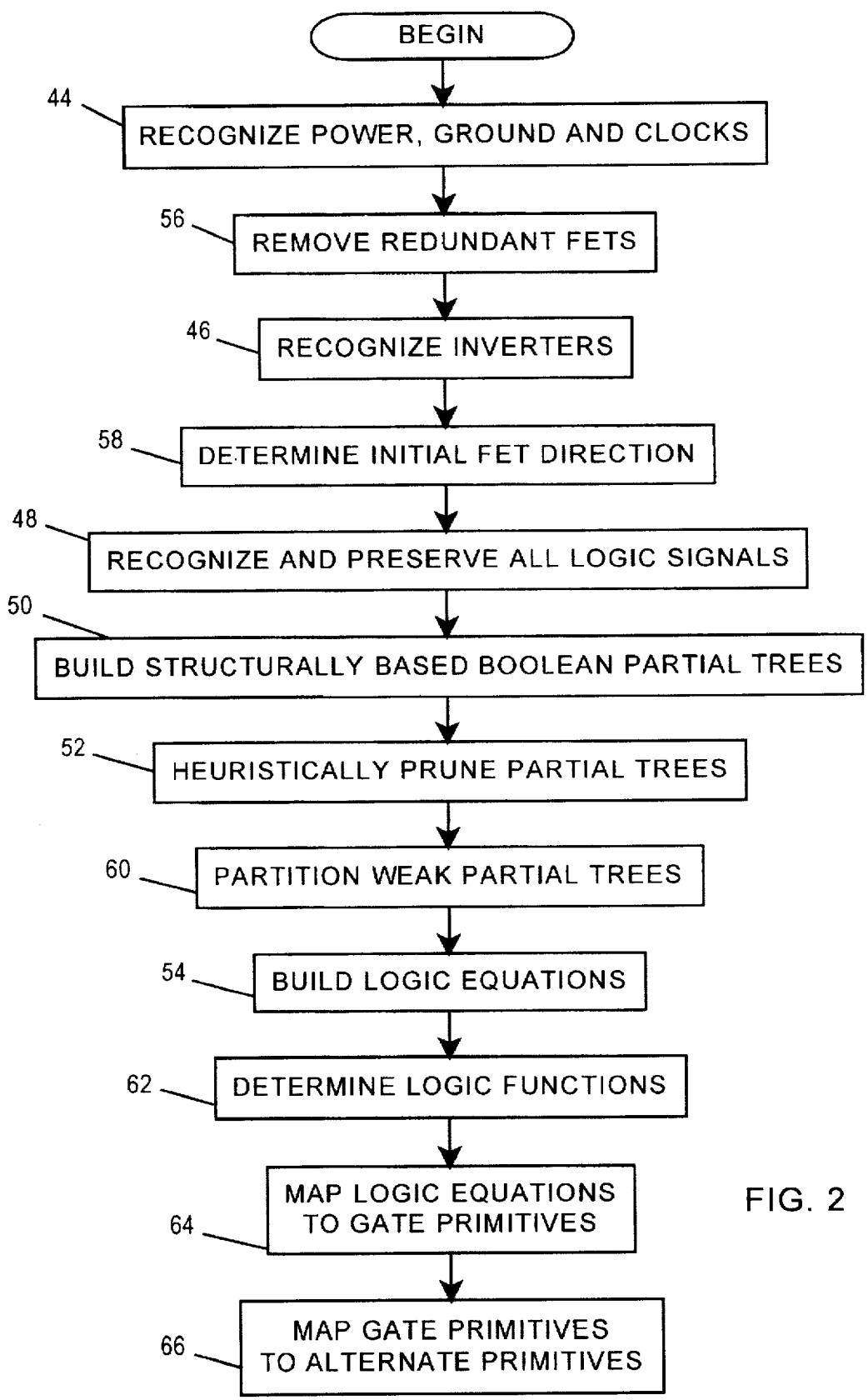
FIG. 2 is a more detailed flow chart of the method for extracting a gate model from a fet model shown in FIG. 1.

In a preferred embodiment, the method comprises the expanded sequence of steps shown in FIG. 2. The method requires that the information contained in the fet modeled circuit be provided to the expert system in the form of an input netlist. A netlist provides a list of terminals connected to each net (node) of a circuit.

An outer layer (or shell) of the system may be responsible for validating arguments, validating the existence of files, reading the input netlist into a database and translating it into Prolog terms, and optionally translating the output netlist into an alternately formatted netlist. After the outer layer translates the input netlist into Prolog terms, the inferencing engine is launched. It is the inferencing engine that actually determines which steps of the method will be carried out, and when. As rules are fired by the inferencing engine, facts which assist in the creation of a gate model are asserted into the expert system's database.

The inferencing engine first opens a series of sequential rule groups. The first of these is a rule group which is responsible for recognizing power, ground and clock signals. The signal naming conventions which will be used for power, ground and clock signals are:

| | |
|---|---|
| NEG: | *GND, GND, GND*, gnd*, gnd, *gnd, VSS, vss |
| POS: | *VDD, VDD, VDD*, *vdd, vdd, vdd*, *VCC, VCC, VCC*, *vcc, vcc, vcc*, *VGG, VGG, VGG*, *vgg, vgg, vgg* |
| CLK: | CK, CK*, ck, ck*, NCK, NCK*, nck, nck*, *CLK, CLK, CLK*, *clk, clk, clk*, *CKH, (CKH), *ckh, (ckh), *CKL, (CKL), *ckl, (ckl) |

(* represents one or more characters)

This method recognizes these conventions and asserts facts about these signals into the expert system's database 44. However, the conventions may be overridden by properties included in the input netlist (or in a separate file associated with the netlist).

Next, the inference engine sequentially chains to a redundant fet removal rule group. Although not a mandatory step, the process of removing redundant fets greatly simplifies later computation and abstraction steps.

Figure 4:
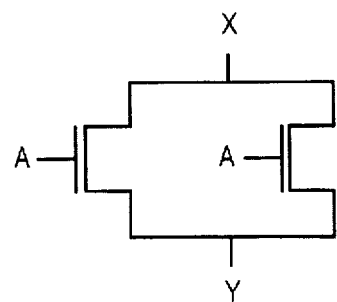
FIG. 4 is a schematic showing redundant parallel fets A.

The removal of redundant parallel fets is quite simple. If two or more fets share common source, drain, and gate connections, all but one of them can be removed. See FIG. 4. However, the method goes one step further and removes redundant "fet structures". The removal of redundant "fet structures" is not so simple. Pseudocode implementing heuristics which check fet structures for equivalency (or redundancy) is given below:

```
For each signal, S, in circuit
    For each pair of fets, F1, F2, connected to S
        IF F1 & F2 of same type
            Put F1 (F2) in tree Tree1 (Tree2)
            IF redundant_trees_from_fets (F1, F2, Tree1, Tree2)
                mark tree Tree2 as redundant with Tree1
redundant_trees_from_fets (F1, F2, Tree1, Tree2):
    IF gate signals of F1 & F2 not same return FALSE
    Locate signals on other side of fets: S1, S2
    IF S1 = S2 return TRUE
    IF either S1 or S2 is a port return FALSE
    IF either S1 or S2 power or ground return FALSE
    IF seen S1 (S2) in Tree1 (Tree2) before return FALSE
    For each instance, I1, connected to S1
        IF I1 in Tree1 or Tree2 return FALSE
        IF S1 is connected to the gate of I1 return FALSE
        IF I1 is not a fet return FALSE
        IF Instance I2, connected to S2, & I2 same type as I1
            & I2 not in Tree1 nor Tree2
                Add I1 (I2) to Tree1 (Tree2)
                IF NOT redundant_trees_from_fets (I1,
                    I2, Tree1, Tree2)
                        return FALSE
        ELSE return FALSE
    return TRUE
```

For simplification, the above redundant removal process requires 1) that all fet gate signals in a tree of one fet structure be identical to the corresponding fet gate signals in a redundant fet structure, and 2) that a fet structure does not include a feedback loop.

Figure 5:
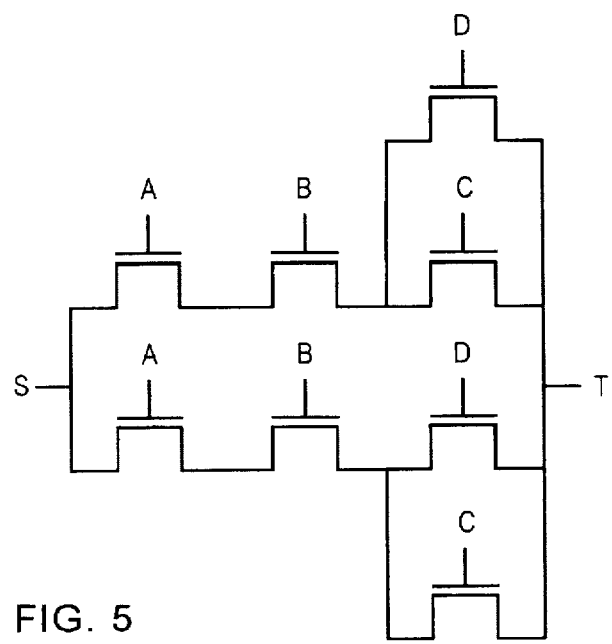
FIG. 5 is a schematic showing complex fet redundancies of fets A, B, C and D.

The removal process starts at two fets connected to a common node via their sources and/or drains (see node S in FIG. 5). The connected fets must be of the same type (both n-fet or both p-fet). Furthermore, the gate signals of the connected fets must be identical. Fet structure trees are created for each of the fets connected to the common node. The trees are created by traversing paths through fet source/drain connections until the two trees reconverge at a common node (node T in FIG. 5).

Circuit annotations or properties can be added to the input netlist to declare an instance to be redundant (forcing its removal) or to prevent the redundant fet removal process from removing a fet.

The inference engine may sequentially chain to two additional rule groups at this point in the method. First, fets used as capacitors may be heuristically recognized, and facts concerning these fets may be asserted into the expert system's database. A fet is asserted to be a capacitor if 1) both its source and drain are connected to power (or both to ground) (See FIG. 64), or 2) it is permanently disabled (i.e. an n-fet with its gate wired to ground, or a p-fet with its gate wired to power) (See FIG. 65). Second, all fets having either a source or drain wired to a rail (power or ground) are so noted in the database. Both of these steps simplify the later step of heuristic partial tree pruning.

The next step in the method is the recognition of inverters 46. Again, the inference engine sequentially chains to the rule group for this step. As the most basic logic gate, it is crucial to recognize inverters so that abstractions can be made, and logic in the gate model can be minimized. Inverters are recognized by pattern matching a pair of fets wherein 1) each of the fets has a source/drain connection to a common logic signal, 2) one fet, a p-fet, has a source/drain connected to power, and the other fet, an n-fet, has a source/drain connected to ground, and 3) the gate signals of the fets are connected to a common logic signal. Inverting relationships are also recognized by the convention that an input port in the netlist with signal name N<sig> is the inverse of input port <sig>.

After recognizing inverters 46, initial fet directions are determined for as many fets as possible 58. Initial fet directions are determined by locating a power or ground signal, and then traversing the source/drain connections of one or more fets connected in series to, and leading away from, the power or ground connection. A fet connected to power or ground on one end (source/drain) is asserted into the database as driving a signal at its other end (source/drain). The source/drain connections of fets are traversed (asserting into the database that each fet traversed drives away from power or ground) as long as the driven ends of the fets are connected to only one other fet, and no port, fet gate, or non-fet instance is encountered. The rule group used to determine initial fet directions should be a forward chaining rule The above steps have comprised the opening of a sequential or forward chaining rule group. The next several steps comprise opening a backward chaining rule groups.

Figure 6:
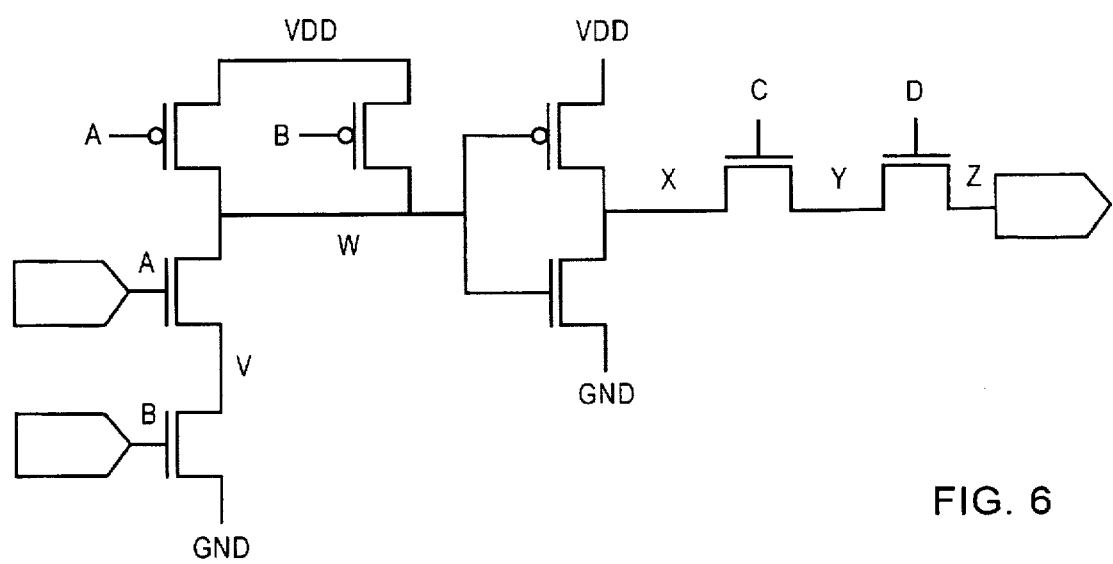
FIG. 6 is a schematic showing various logic and intermediate signals.

A critical step in this method is the recognition and preservation of all logic signals in a circuit 48. Logic signals represent a subset of signals for which logic will be generated. All other circuit signals are considered intermediate and can be subsumed during the gate model extraction process. A logic signal is defined as any signal which is connected to a port (excluding power and ground ports), a fet gate, or a non-fet instance. Non-fet instances comprise instances in the fet modeled circuit where a designer has provided an abstraction in lieu of a fet implementation. For example, the connections to an adder or comparator would be connections to a non-fet instance. In FIG. 6, the recognized logic signals would be A, B, C, D, W and Z. V, X and Y would be considered intermediate signals and could be subsumed in the extraction process.

It is important to recognize logic signals so that the resultant gate model will have a structural correspondence with its fet model. Other gate model extraction methods fail to recognize logic signals, and as a result, most, if not all, logic signals are left out of the gate model. Although other gate extracted models may have allowed testing of a circuit on a pass/fail basis, the fet circuit was difficult to debug, once an error was noted, because of its lack of sructural similarity to the gate model which was tested.

The next step in the method comprises building one or more structurally based boolean partial trees for each of the recognized logic signals 50. The structural basis for the partial trees is source/drain fet connections of the input netlist. A partial boolean tree is constructed for each fet connected to a logic signal. The root of the tree is the logic signal. The connecting fet could be considered the trunk. All other fets connected to the other side of the trunk begin the branches that fan out (connecting fets end-to-end) until another logic signal or power/ground signal is reached (the leaves). Thus, a particular logic signal may have several partial trees forest) associated with it (one for each fet connected to it).

Since the partial trees are structurally based, the branches represent fets in the fet model, and not just logical path. Structurally based boolean partial trees are similar to BDDs (boolean decision diagrams), but go one step further in adding a structural basis to the tree. Previous trees have not done this. BDDs are logic based, and do not correspond to any structure.

Since partial trees terminate at other logic signals, they are relatively small, and consequently, easy to manage and reason from. BDDs, and other similar approaches, on the other hand, can grow to be quite large and unwieldy, becoming expensive to manage in both time and space.

Some of the partial trees will be 1-trees, representing fets which can drive a logic signal high (to power), and some of the trees will be 0-trees, representing fets which can drive a logic signal low (to ground). Thus, a NOR gate would have two 0-partial trees, and a NAND gate would have two 1-partial trees.

Figure 7:
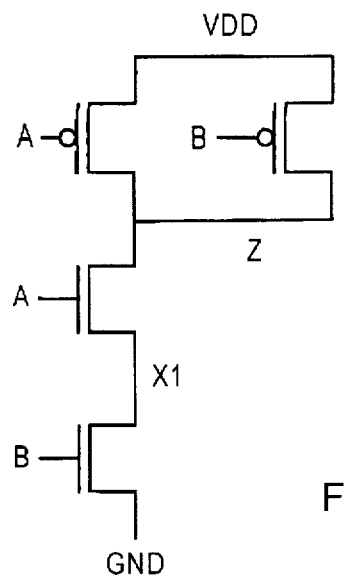
FIG. 7 is a schematic showing the various fets connected to logic signal Z.
Figure 8:
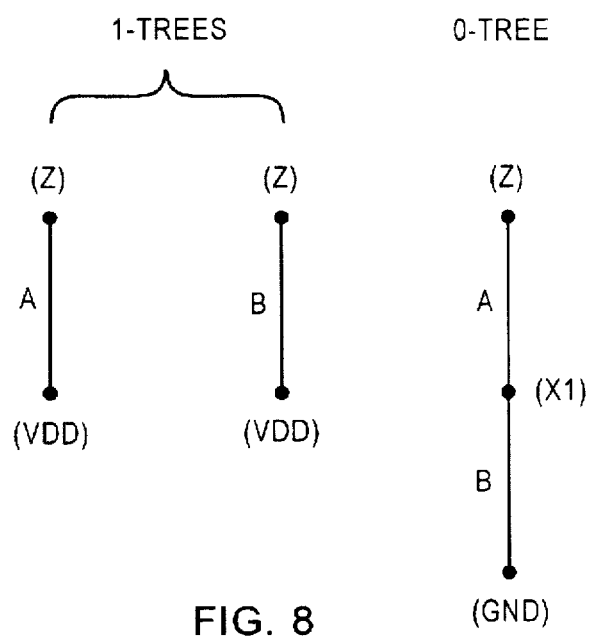
FIG. 8 shows the partial trees generated for logic signal Z of FIG. 7 by the method of FIGS. 1 or 2.

Logic signal Z of FIG. 7 would be associated with three partial trees, as demonstrated in FIG. 8.

A partial tree is built by starting at a logic signal, identifying a fet connected to the logic signal by its source or drain (which becomes the trunk of the partial tree), and then adding to the partial tree any fets which are connected to the trunk, end to end, via a source and/or drain connection. A partial tree branch ends when either a power, ground, or logic signal is encountered.

Since at this stage the partial trees are built without regard to fet or port directions, it is possible that tree branches will be replicated in various of the partial trees. For example, the partial tree of logic signal Z in FIG. 15 including fet F1 and ending at logic signal Y would also appear as a partial tree of Y ending at Z.

As partial trees are built, they may be pruned via a simple rule. If conflicting gate signals are found in a tree branch (due to a previous identification of logic inversion), that branch is pruned. For example, if a fet with a gate signal of A is in series with a fet having a gate signal of ¯A (not A or the inverse of A), then that branch is pruned because it represents a logical impossibility.

For each partial tree, a maximum strength may be computed. The calculations start with a strength of 63 at the rails (power and ground) and then subtract a computed fet "resistance" for each fet in a series branch path. A strength cannot fall below one. The resistance is calculated as R=max (K*L/W,L) where W and L are, respectively, the width and length of a fet. K is a process-specific factor with unique values for n-fets and p-fets. A gate with a lower resistance is going to add greater strength to a path. The maximum strength of a partial tree is equal to the strength of the partial tree's strongest branch path. Strength calculations can be used in conjunction with later rules, such as identification of feedback paths.

Figure 3:
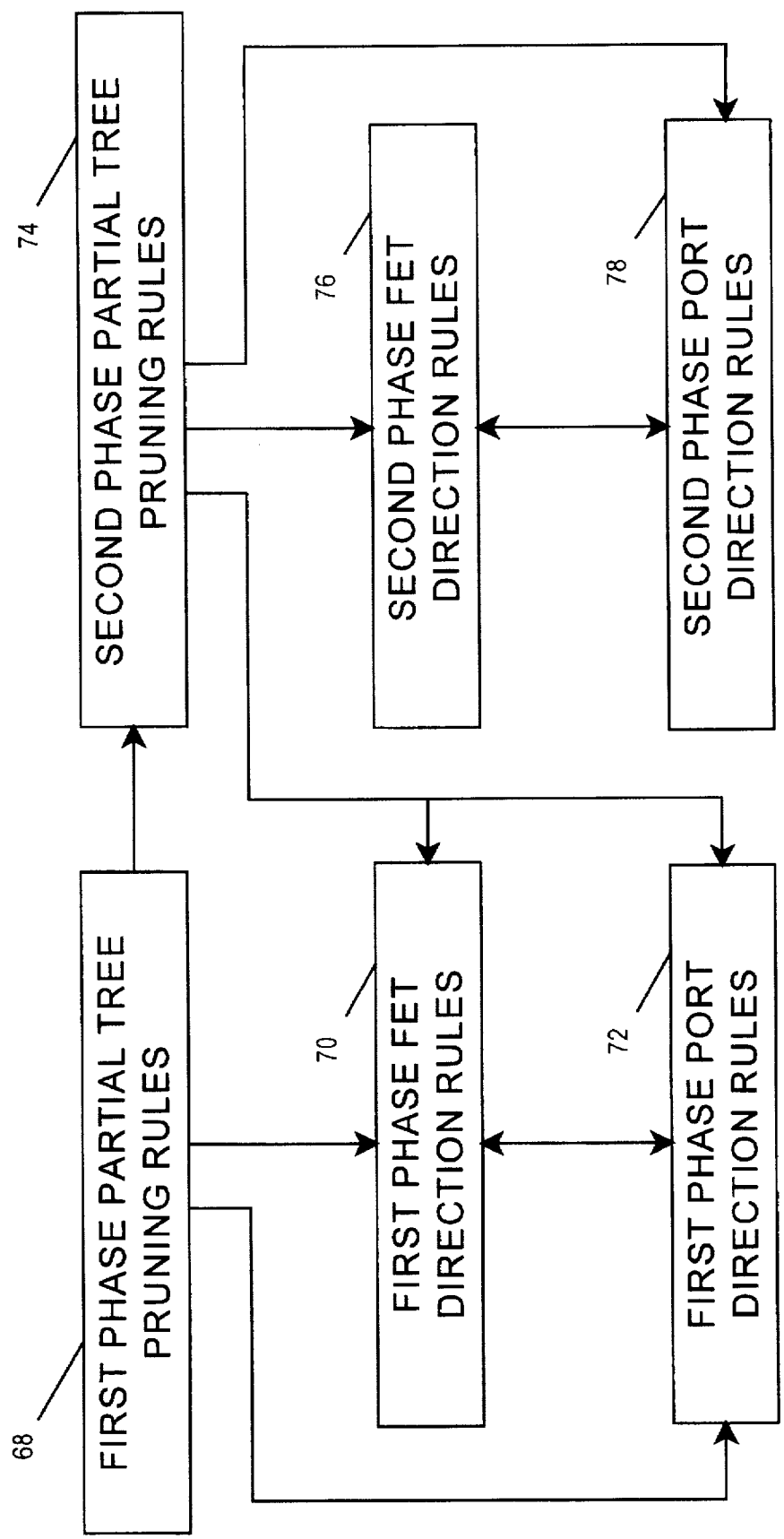
FIG. 3 is a flow chart of the chaining which occurs between the partial tree pruning, fet direction, and port direction rule groups used in the method of FIGS. 1 or 2.

After the structurally based partial trees are built 50, they are heuristically pruned 52 using a number of additional backward chaining rule groups (FIG. 3). The rule groups are subdivided into first and second phase groups. Pruning begins with the first phase rules, and if necessary, proceeds to the second phase rules. Finally (also if necessary), a user is prompted for information. Each of the first and second phase rule groups is further subdivided into partial tree pruning rules 68, 74, fet direction rules 70, 76, and port direction rules 72, 78. The fet and port direction rules are accessed by backward chaining from the partial tree pruning rules. The theory behind the rule phases is that the method should accomplish as much as possible without prompting a user. If the expert system cannot obtain enough information from the input netlist or its own reasoning rules, then information can be acquired from & user.

As the first phase partial tree pruning rules 68 are being fired, facts concerning a gate model are being asserted into the database. The facts include fet directions, port directions and information concerning logical flow paths (i.e., paths which cannot be realized are pruned).

The port direction, either input, output, or bidirectional, is not always specified in the input netlist. As a result, the method must often infer this information from the circuit. Similarly, the direction of every fet is usually not given, and so that also has to be determined. This is done at this point in the method since many tree pruning rules require this information.

A first phase partial tree pruning rule will query for a fet or port direction whenever one is needed. When a query is made, the inferencing engine determines if the query has been made before, and if so, whether the fet or port direction exists in the database. If it does not, the inferencing engine will backward chain to a first phase fet 70 or port 72 direction rule group. If the fet or port direction cannot be determined, the query is returned unfulfilled. As additional information is asserted into the database, there may come a time when the query will be made again, and fulfilled. Otherwise, a determination of the fet or port direction will have to wait until second phase rules are opened, and either the second phase rules or a user's input can fulfill the query.

Once the first phase rules have accomplished as much as they can, the second phase partial tree pruning rules 74 are opened by the inferencing engine. The second phase pruning rules 74 may query either the first or second phase fet 70, 76 or port 72, 78 direction rules. In the second phase, when a fet or port direction cannot be inferred using the rule groups, a user is prompted for the direction. Once the direction is provided, rules fire again until all rules which can fire using the new information have so fired. Optionally, when a user is unable to attend to the running of the method, the method can be instructed to run in a non-interactive mode. When running in non-interactive mode, the method should assert that unknown port and fet directions are bidirectional.

The structural basis of the partial trees enables the inference engine to determine when partial tree pruning is complete. Partial tree pruning is complete when the directions of all fets (branches of the partial trees) are known, and no more tree pruning rules 68, 74 are able to fire.

With a logical tree structure (as in the traditional BDD used by some modeling processes), the inability to resolve the direction of bidirectional fets and ports adds additional complexity to the resultant gate model. It is impossible to force the determination of a fet or port direction when using logical trees. This is because fet structures are not represented, and many logic signals are subsumed by the gate modeling process.

The use of structural based boolean trees not only adds a structural correspondence to the gate model, but also assists in simplifying the logic of the gate model.

The heuristic partial tree pruning rules follow:

1. First Phase Partial Tree Pruning Rules

Figure 9:
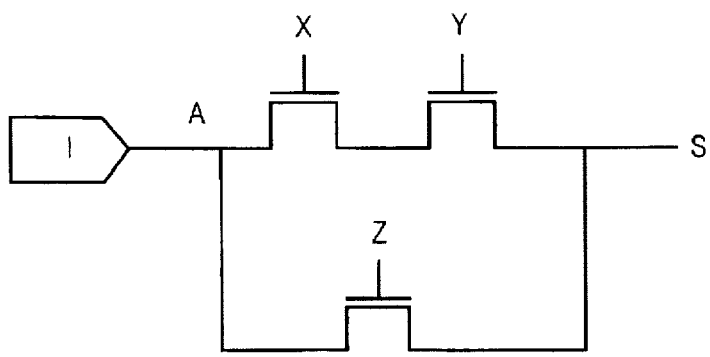
FIG. 9 is a schematic showing all connections to input port A being connected to only one logic signal, S.

A partial tree is pruned in its entirety if the logic signal at its root is an input port and all of the partial tree's branches terminate at a common logic signal. A first phase port direction rule may be fired via a backward chaining query to determine whether the partial tree's root is an input port. The reasoning behind this rule is that the flow between an input port and a single logic signal has to be away from the input port. Since the direction of flow implied by the partial tree is towards the input port, the tree rooted at the input port represents a false logic path and must be pruned. FIG. 9 demonstrates the application of this rule. Input port A has a partial tree from logic signal S which would be pruned.

Figure 10:
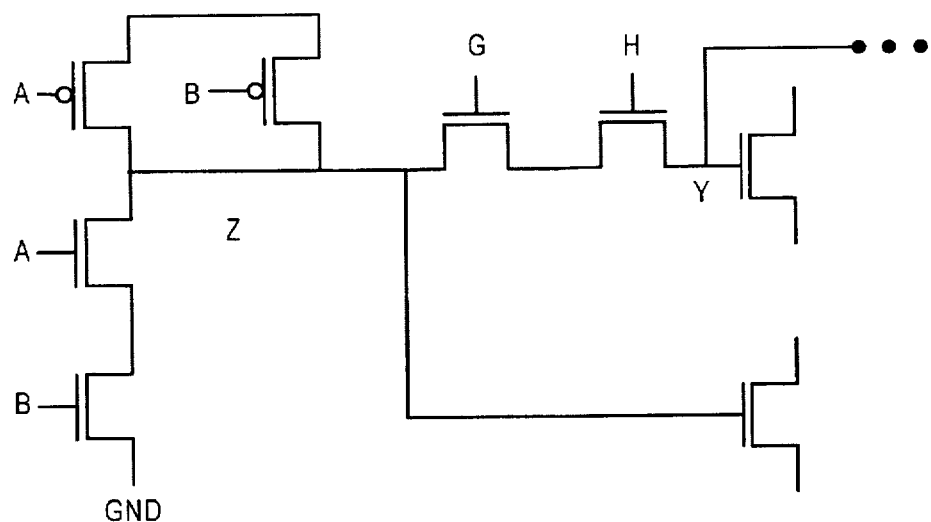
FIG. 10 is a schematic showing a signal Z driven by a sound NAND gate.

A partial tree for a logic signal is also pruned in its entirety if it is weaker than a group of "sound" trees for the logic signal. Sound trees represent a gate that is always driving, such as a fully complimentary CMOS gate (e.g. —a NAND gate). The reason for this rule is that a partial tree which is weaker than a sound gate is incapable of affecting the value of its root logic signal. For example, in FIG. 10, the partial tree built from Y to Z is pruned if it is determined that Z is driven by a sound NAND gate which is stronger than the Y to Z path.

Figure 11:
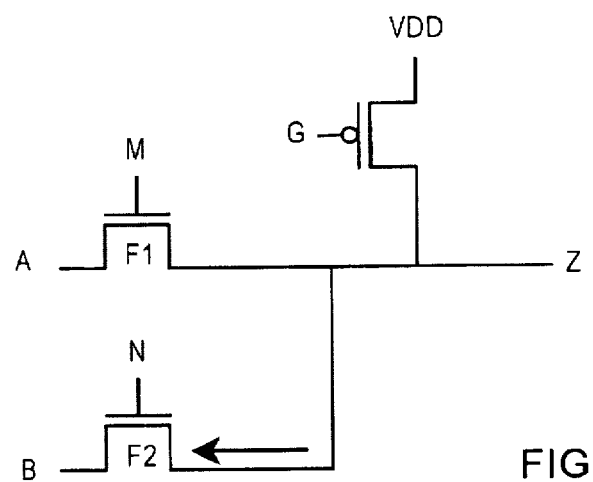
FIG. 11 is a schematic showing a fet, F2, having a direction which is opposite to its implied direction.

A branch of a partial tree is pruned when it can be heuristically determined that the actual direction of a fet in the branch is opposite to the implied direction of the fet. The implied direction of a fet in a partial tree is that it drives toward the partial tree's root. Therefore, if it is determined that a fet actually drives away from a partial tree's root, the branch is not a logical path, and must be pruned. A first phase fet direction rule may be called via a backward chaining query. In FIG. 11, the partial tree of Z comprising fet F2 is pruned once it is determined that F2 actually drives toward B (rather than towards Z, the root of the partial tree in question).

Figure 12:
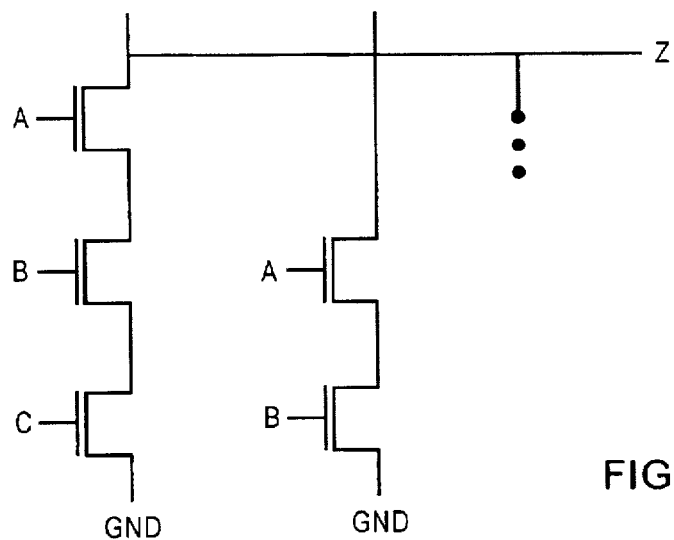
FIG. 12 is a schematic showing a logic path which is subsumed by an alternative logic path.

A partial tree is pruned in its entirety if another partial tree rooted in the same logic signal subsumes it. This pruning step involves a logical pruning of the structural partial trees. For example, if a partial tree represents a logic function of 'A and B', and another partial tree represents the logic function 'A and B and C', the later partial tree is pruned because it is logically subsumed by the former. Refer to the example in FIG. 12.

Figure 13:
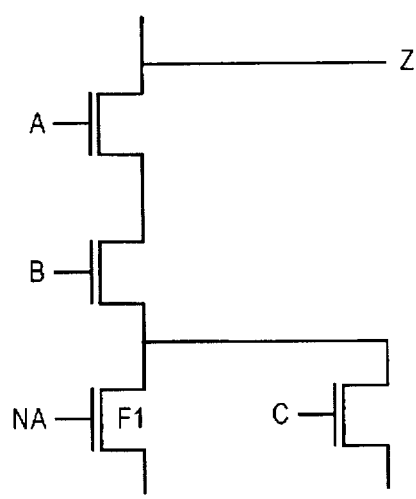
FIG. 13 is a schematic of a logic path having fets A and NA with inconsistent gate signals.
Figure 14:
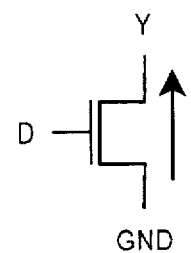
FIG. 14 is a schematic showing fet D connected to ground.

Finally, a branch of a partial tree is pruned if two of its fet's gate signals contradict each other. For example, if a fet in a branch has a gate signal of A, and another fet in the same branch has a gate signal of NA (not A), the branch must be pruned because such a path is impossible to realize. If the fets of FIG. 13 comprised a partial tree of Z, the branch starting at fet F1 would be pruned due to the conflicting gate signals of A and NA.

2. First Phase Fet Direction Rules

The following rules are backward chaining, only being fired when the direction of a particular fet is in question.

If a fet is a special type of unidirectional fet, it may be compared to fets in a library of unidirectional fets —its direction is derived from the library and asserted into the database.

If a fet direction in included in the fet model netlist (input netlist), the direction provided in the fet model netlist (a netlist property) is asserted into the database.

A fet connected to power or ground drives away from the power or ground connection. See FIG.

Figure 15:
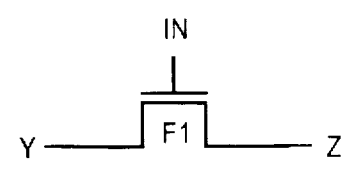
FIG. 15 is a schematic showing fet F1, which would be included in the partial trees of logic signals Y and Z.

As earlier stated, the implied direction of a fet is that it drives towards the root of a partial tree. If the implied direction of a fet is consistent in all of the partial trees to which it belongs, then its implied direction is asserted to be its actual direction. In FIG. 15, fet F1 is a member of the partial trees of logic signals Y and Z. If F1 is pruned from the partial tree of Y, then application of this rule dictates that Ft drives towards Z (no other partial tree suggests a conflicting direction).

Figure 16:
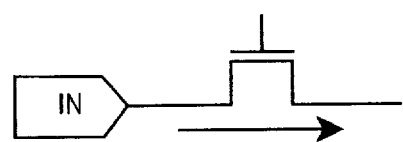
FIG. 16 is a schematic showing a fet driving away from an input port.
Figure 17:
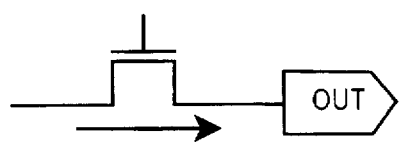
FIG. 17 is a schematic showing a fet driving towards an output port.

If a fet comprises the only connection to a port, and the fet is connected to the port via its source or drain, then the fet drives away from the port if it is an input port, and towards the port if it is an output port. No conclusion concerning fet direction is drawn (by this rule) when the port is bidirectional. Examples of fets asserted to drive away from or towards a port are pictured in FIGS. 16 and 17.

Figure 18:
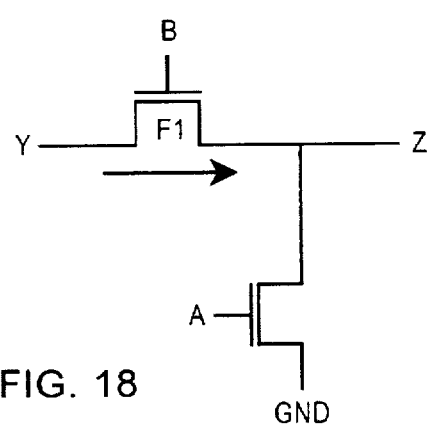
FIG. 18 is a schematic showing fet F1, which is the only fet capable of driving signal Z to logic 1.

If a partial tree is the only partial tree capable of pulling a logic signal in one direction (i.e. —to ground or to power), then the fets of that partial tree must drive the logic signal, and the fets' implied directions are asserted to be their actual directions. This heuristic assumes that all logic signals not connected to a port must be capable of being driven to both rails (power and ground) by the fets which drive them. Logic signals connected to ports are excluded from this rule because logic external to the circuit can affect them. This rule ignores the fact that a fet may be bidirectional. However, it rarely fails, partly due to the rarity of bidirectional fets. In FIG. 18, fet F1 is the only fet capable of driving Z to a "1", so F1 is asserted to drive towards Z.

Figure 19:
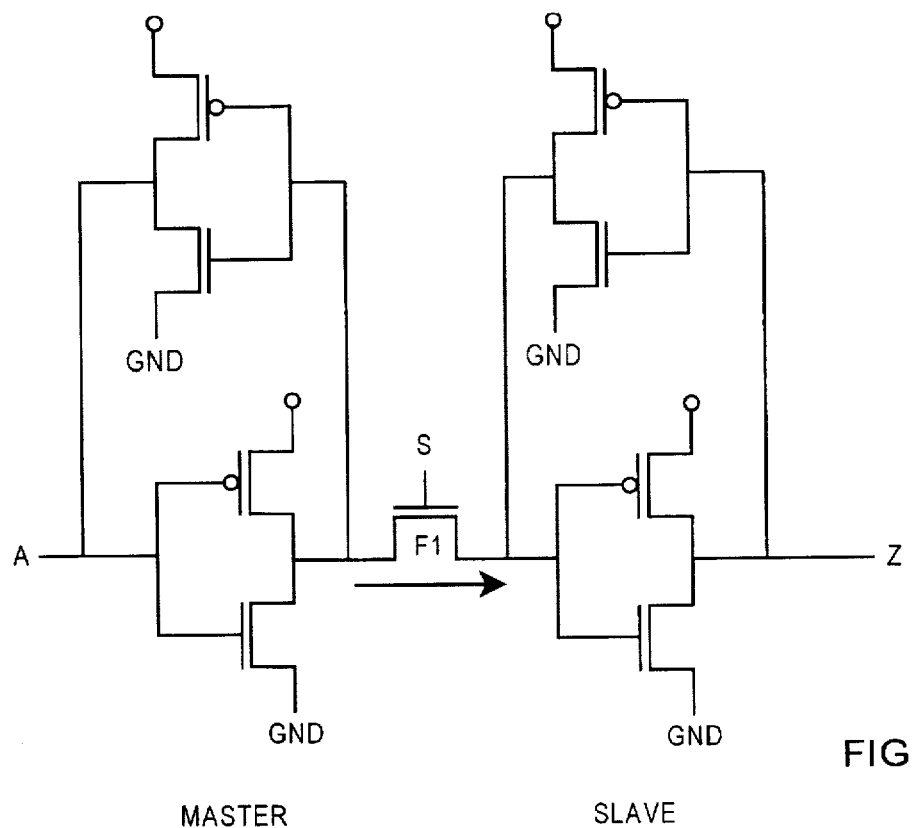
FIG. 19 is a schematic showing transfer fet F1 of a master/slave register.

If a fet is driven by a 'sound' logic gate (like an inverter or fully complementary NAND gate) which is stronger than any possible tree that could drive against it, then the fet is asserted to drive away from the larger logic gate. For example, in a master slave register, the master inverter is much larger than the slave's feedback inverter, so the direction of the transfer fet between master and slave is determined to drive towards the slave. See transfer fet S in FIG. 19.

3. First Phase Port Direction Rules

If a port direction property exists in the input netlist, then the port direction is as specified.

Power and ground always have the direction of input.

If a port is a pass-thru port, its direction is input. Pass-thru ports have no connections to the circuit and are merely copied from the fet model to the gate model for the purpose of consistency.

Figure 20:
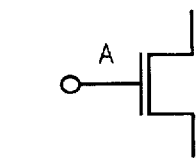
FIG. 20 is a schematic showing non-driven port A.

The direction of a non-driven port (one that is only connected to fet gates) is input, as in port A of FIG. 20.

Figure 21:
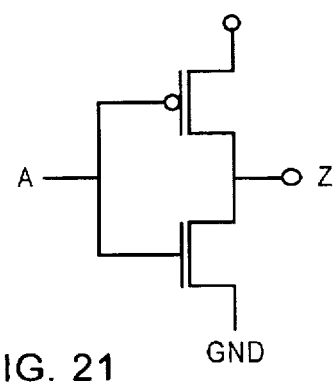
FIG. 21 is a schematic showing sound logic driving port Z.

If the logic driving a port is sound, and the port is not associated with a feedback path, then the direction of the port is output, as in port Z of FIG. 21.

4. Second Phase Partial Tree Pruning Rules

If the actual direction of a fet is opposite to that implied by its partial tree branch, the branch comprising that fet is pruned. This rule is identical to a first phase pruning rule, but for the fact that fet and port directions may be obtained through backward chaining queries to the second phase fet 76 and port 78 direction rules. After obtaining new information concerning a fet or port direction, backward chaining queries may be made to any of the first phase rule groups.

5. Second Phase Fet Direction Rules

The second phase fet direction rule is to simply prompt the user for a fet direction. A user may reply that a fet drives a specific signal, or that a fet is truly bidirectional.

If a user is not available for prompting, a fet is assumed to be bidirectional

6. Second Phase Port Direction Rules

Figure 22:
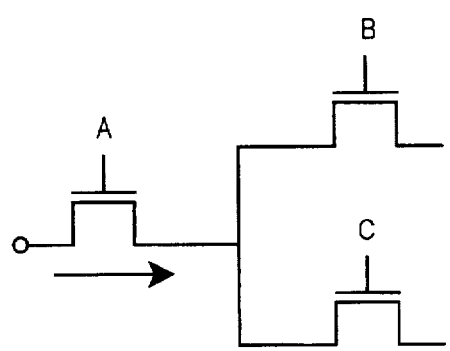
FIG. 22 is a schematic showing undriven input port Z.

If all of a port's partial trees have been eliminated, then the port (port Z in FIG. 22), being undriven, has a direction of input.

Figure 23:
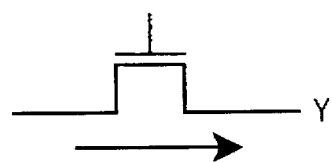
FIG. 23 is a schematic showing output port Y.
Figure 24:
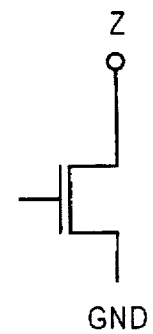
FIG. 24 is a schematic showing bidirectional port Z.

If a port appears in the root of a partial tree, but has been eliminated as a "leaf" from all other partial trees, the direction of the port must be either output or bidirectional. If the port (port Y in FIG. 23) is driven by the circuit to both rails, it's direction is asserted to be output. Otherwise, it is asserted to be bidirectional, as in port Z of FIG. 24 (this bidirectional heuristic makes the port more testable for test pattern generators).

If the direction of a port is still unknown, a user is prompted for its direction.

In an alternate embodiment of the expert system apparatus, the system can be instructed to put a given "effort" into obtaining fet or port directions. For example, when extracting a gate model from a very large fet model, the system can be instructed to exert no more than a certain degree of work before a user is prompted for a let or port direction. In this manner, the number of computations performed by a computer can be reduced, and the run-time of the method can be decreased.

The remainder of the rule groups accessed by the inference engine (but for determination of logic functions) are sequential rule groups.

A key feature of this method is its ability to partition weak partial trees from non-weak (strong/dominant) partial trees 60. Partitioning assists in abstracting logic functions for a gate model. For example, separating a weak partial tree representing the weak feedback inverter of a latch from the strong partial trees driving the latch enables the latch to be abstracted for what it is, thus modeling the latch more naturally in a gate model. Other methods, though capturing state instances implemented using a number of fets, retain no correspondence to the original fet structure or storage signals of a circuit.

As earlier stated, the maximum strength of a partial tree is equal to the strength of the strongest path through the partial tree. Weak and non-weak trees are separated through a comparison of the various partial trees' maximum strengths.

Weak partial trees are separated from the non-weak 1- and 0-trees of a logic signal. When a partial tree is marked as weak, the "entire" partial tree is weak. A partial tree should not be further subdivided into weak and non-weak parts.

An assumption is made that if there is no feedback, then there is no need to create a weak partial tree. This assumption greatly simplifies the work of partitioning weak trees from non-weak trees. Although the assumption is not always true (e.g., feedback may exist external to the circuit which was modeled), it is true in so many cases that its benefits greatly outweigh its detriments.

Figure 25:
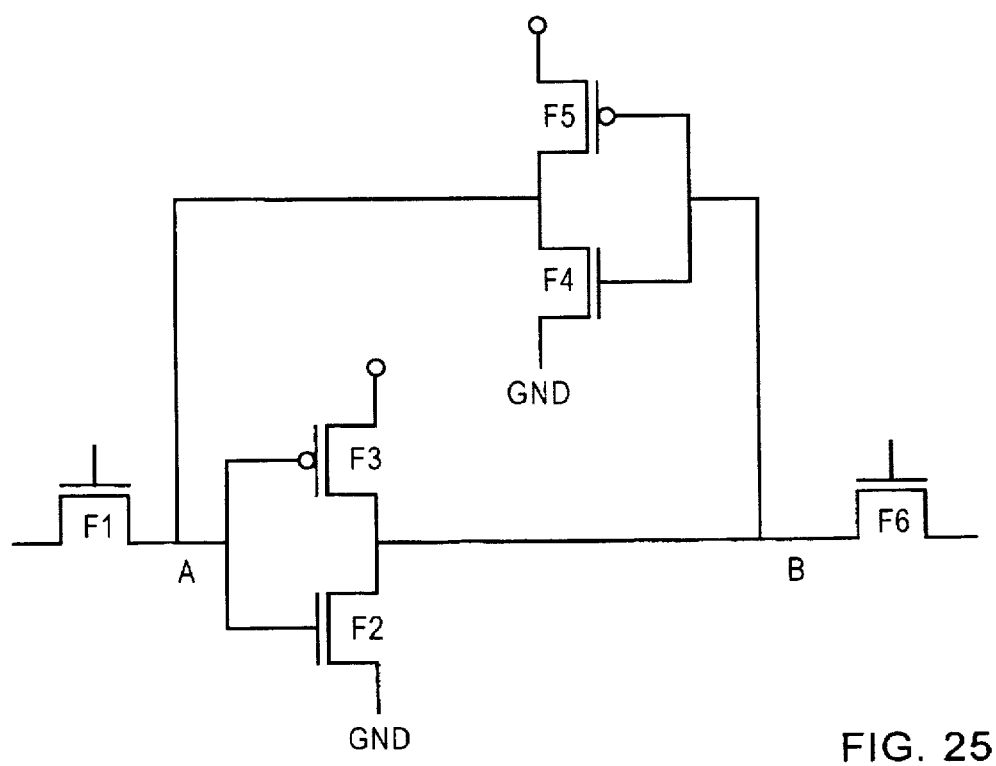
FIG. 25 is a schematic showing 2-way feedback.
Figure 26:
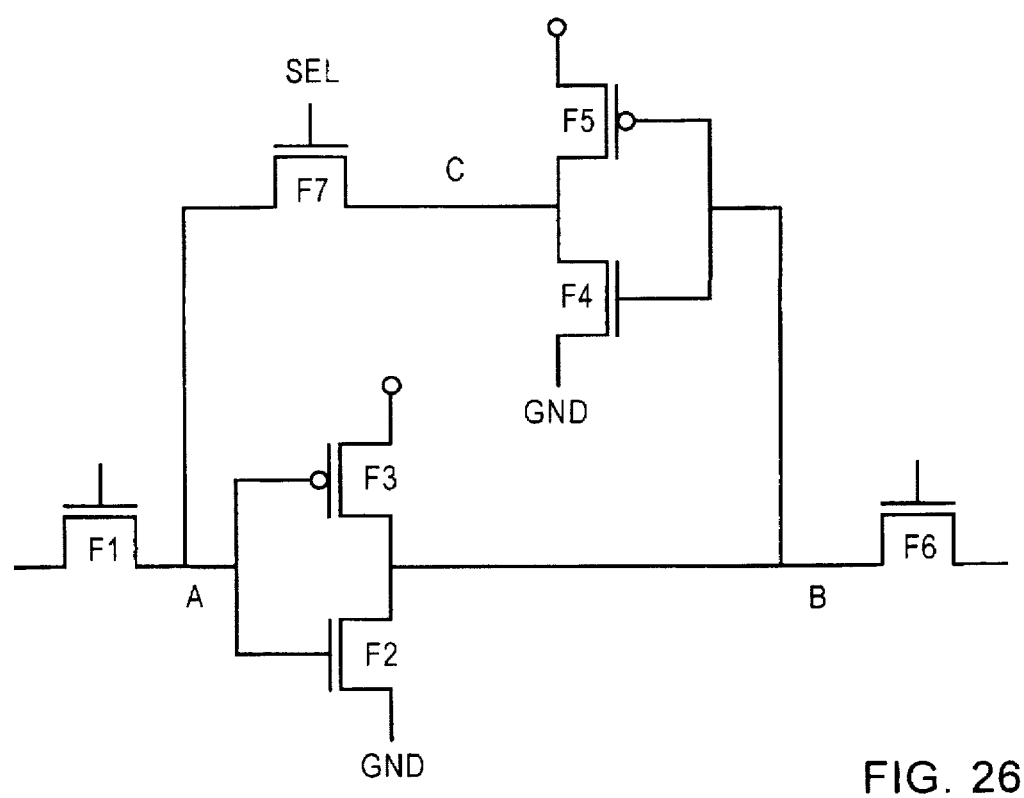
FIG. 26 is a schematic showing 3-way feedback.

To begin the separation process, feedback trees must be recognized. The partial trees are examined for two trees that are cross-coupled. That is, each partial tree's logic signal is an input to the other tree. This is an example of 2-way feedback. In FIG. 25, fets F1, F4 and F5 are in the trees for signal A, and fets F2, F3 and F6 are in the trees for signal B. Consequently, there is feedback between A and B. 3-way and 4-way feedback can also be recognized using this method (as where the feedback between two trees actually goes through other trees). In FIG. 26, the feedback between logic signals A and B goes through the partial trees of signal C.

A partial tree involved with feedback is a weak partial tree if there exists another partial tree on the "opposite side" which is stronger, and the two partial trees are not "disjoint". The terminology "opposite side" refers to a partial tree that drives to the opposite rail (a 1-tree vs. a 0-tree). "Disjoint" means that it is impossible for the partial trees to be driving at the same time (determined by the logic of the trees). The disjoint restriction prevents an n-fet of a feed forward inverter from being classified as weak because its not as strong as the p-fet leg of the same inverter. In FIG. 25, partial trees F4 and F5 are marked as weak because they are weaker than F1, which can drive signal A to either rail.

Figure 27:
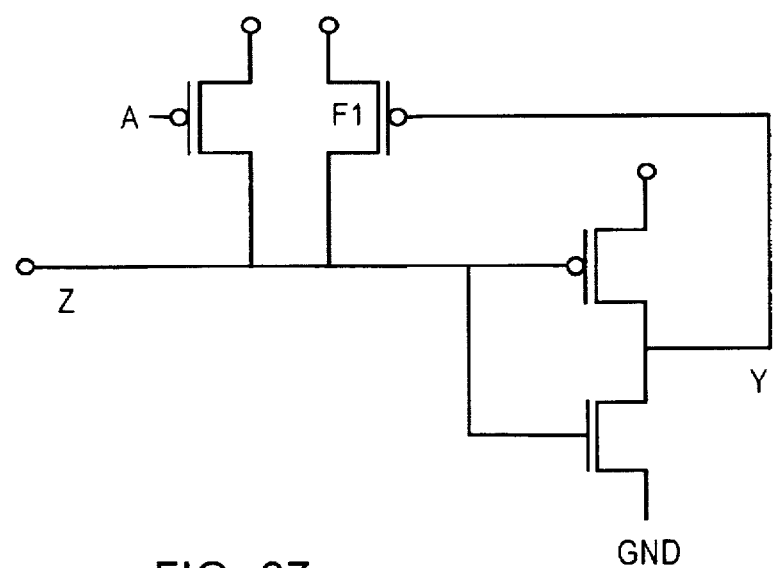
FIG. 27 is a schematic showing a weak fet, F1, involved in feedback between port Z and signal Y.

A partial tree involved with feedback is also a weak partial tree if there is no partial tree on the opposite side, and the logic signal (i.e. the root of the feedback tree) is either a port, or is driven by non-fet instances. In FIG. 27, fet F1 is marked as weak by this rule since it is involved in feedback between port Z and signal Y.

A partial tree is weak if it is a transfer tree (coming only from another logic signal, and not from power or ground) and the transfer signal is the feedback signal which can be driven to the opposite rail. In FIG. 26, fet F7 is marked as a weak partial tree by this rule.

Finally, a partial tree is a weak tree if a weak partial tree exists on the other side and the partial tree's inputs are a subset of the other partial tree's inputs. This rule picks up the other side of weak logic which is driving a strong fet to only one side. With the strong fet on only one side, the other weak side would not be recognized without this rule. Refer to the example of FIG. 66. Fet F2 is recognized by this rule as being weak because fet F3 would have already been marked as being weak; that is, weaker than F6.

Now that the partial trees have been pruned, and separated into weak and non-weak groups, they are merged to form complete structurally based boolean trees (trees). Prior to this point, the method has been working strictly with partial trees. Each logic signal identified can have up to four trees. The possible trees for a logic signal include a strong 1-tree, a strong 0-tree, a weak 1-tree and a weak 0-tree. The 1-trees are responsible for pulling a logic signal to power, and the 0-trees are responsible for pulling a signal to ground.

The completed boolean trees are used to build a boolean logic equation for each logic signal 54. A simple transform is used to convert each boolean tree into a logic equation. Series fets form a boolean AND clause ("*" clause), and diverging branches (or sub-trees) form a boolean OR clause ("+" clause). For example, a CMOS NOR gate would comprise a 0-tree with two sub-trees (a boolean OR clause), with each sub-tree being capable of pulling the gate's output to ground. The 1-tree of the NOR gate comprises two series fets (a boolean AND clause) capable of pulling the gate's output to power. Logic equations are built for 1-trees in DeMorgan (inverse) form. Thus, the NOR gate's equations (assuming inputs A and B) might appear as:

| | |
|---|---|
| 0-equation = A+B | |
| 1-equation = ¯(¯A*¯B) | (DeMorgan form) |
| A+B | (final simplified form) |

The inversions are dictated by the type of fet in a tree. A p-fet causes an inversion, while an n-fet does not. The reason for using DeMorgan form is to simplify detection of sound logic (both 0- and 1- logic equations will be the same).

Figure 28:
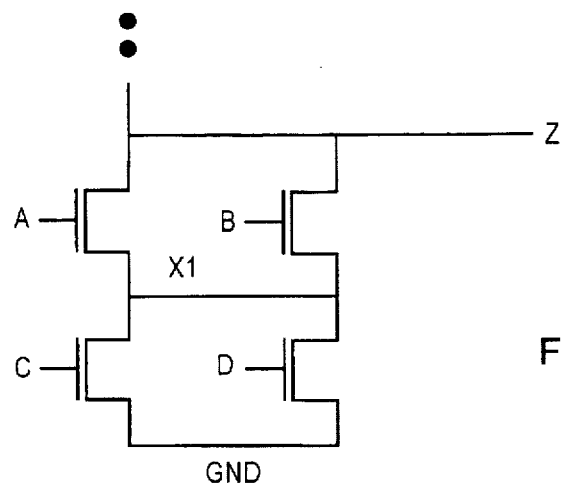
FIG. 28 is a schematic showing the lower half of a CMOS complementary AND-OR gate.

As previously stated, it is a goal of this method to extract a gate model which closely corresponds to fet structures. Though at times this may result in a slightly less optimal logic equation, for the most part, it greatly assists a user in debugging a circuit's problems. Consider, for example, a CMOS complimentary AND-OR gate with the equation (A+B)*(C+D). The lower half of the gate is shown in FIG. 28. Using boolean logic, this equation can be manipulated to the equivalent equation of A*C+B*C+A*D+B*D. However, if the fet structure yields the first equation directly, then it is preferred to retain that equation (fets A and B in parallel and fets C and D in parallel, one parallel structure being in series with the other). The manipulated equation makes it difficult to 'reverse engineer' the fet structure and debug the circuit comprising the fet structure.

Figure 29:
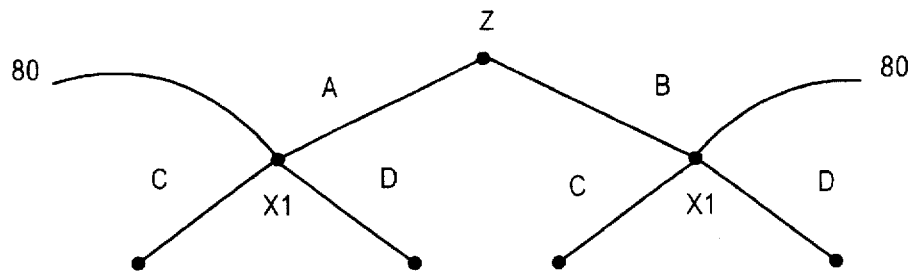
FIG. 29 shows a boolean tree for the gate portion of FIG. 28.

In order to follow the physical structure of a fet model, the transformation from trees to equations requires a slight modification. This is due to the manner in which trees are stored. The stored tree of the AND-OR gate shown in FIG. 28 appears in FIG. 29. A straight tree to equation transformation would result in the equation A*(C+D)+B*(C+D). This equation differs in form from the equation (A+B)*(C+D) because of the lack of parallel recombination in partial trees. To perform parallel recombination, the signal name of a node 80 which begins a sub-tree is stored in the database. In FIG. 29, the name of the node 80 is X1. The node name is stored along with the (C+D) sub-tree structure. Thus, to recombine parallel sub-trees, the first step is to make a list of the nodes in a tree and keep any duplicates. Duplicates mean that the structures under those nodes are duplicated one or more times. With this information, the trees above the duplicated node can be combined.

Figure 30:
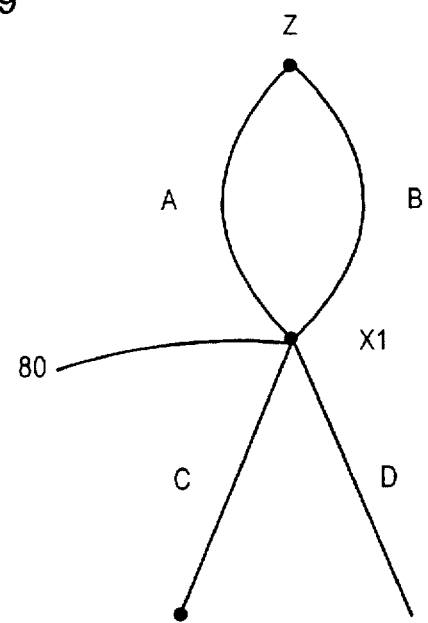
FIG. 30 shows the boolean tree for the gate portion of FIG. 28 after parallel recombination has been performed by the method of FIGS. 1 or 2.

In FIG. 29, the duplicated node 80 is X1. Therefore, the trees above the nodes 80, or trees A and B, can be combined. This yields the tree of FIG. 30 and the equation (A+B)*(C+D), which correctly mimics the parallel fet structure of FIG. 28.

Figure 31:
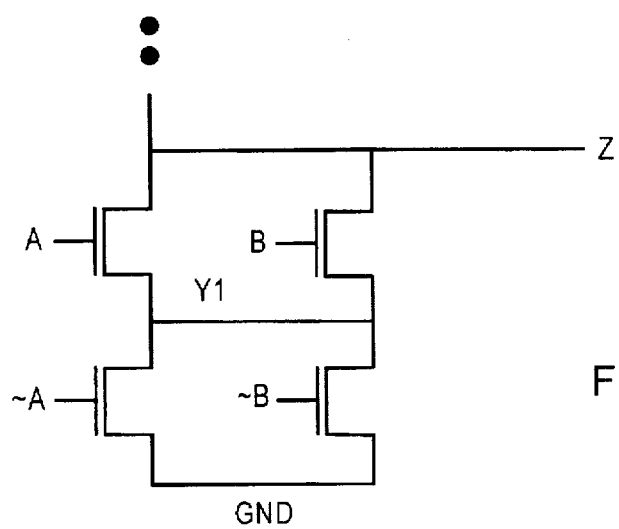
FIG. 31 is a schematic showing a fet structure similar to that of FIG. 28 which may be associated with a boolean tree which should not be subjected to parallel recombination.
Figure 32:
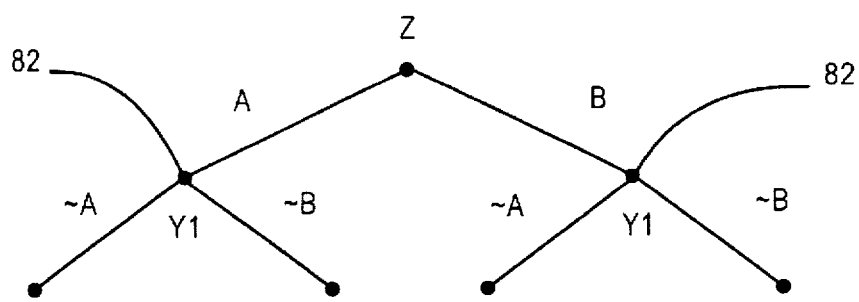
FIG. 32 shows a boolean tree for the schematic of FIG. 31.
Figure 33:
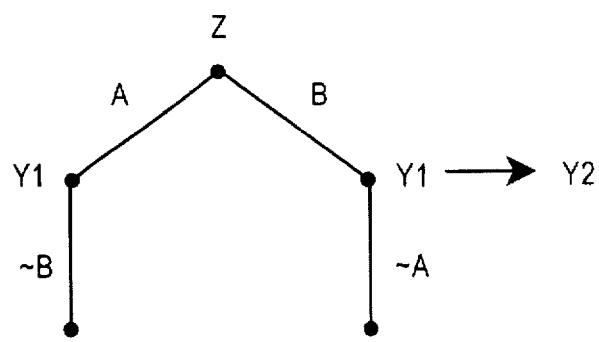
FIG. 33 shows the boolean tree of FIG. 32 after pruning performed by the methods of FIGS. 1 or 2.

A final case needs to be considered in relation to parallel recombination. Consider the fet structure of FIG. 31. The structurally based boolean tree built for this let structure would initially appear as in FIG. 32. Note the existence of the duplicated node 82, Y1. However, during the partial tree pruning process, the complement branches will be pruned (see the above partial tree pruning rules). This results in the tree of FIG. 33, which still has a duplicated node (Y1), but which fails to have duplicated sub-trees. To prevent an attempt at parallel recombination in this case, one of the duplicated nodes 82 is renamed. For example, the duplicated node 82 can be renamed as Y2.

Once the trees have been transformed into equations 54, they are heuristically simplified. An equation goes through a series of symbolic simplifications until there are no more simplifications left to be done. These simplifications do not significantly affect the structural correspondence of the equations. Preferred simplification rule groups are:

(Note: "op" may be either an OR ("+") or an AND ("*") operation)

1. X * (X op B) => X * (1 op B)
   X * (~X op B) => X * (0 op B)
   X + (X op B) => X + (0 op B)
   X + (~X op B) => X + (1 op B)
2. X op (Y op Z) => X op Y op Z
3. X * ~X => 0
   X + ~X => 1
4. X op X => X
5. 0 + X => X
   1 + X => 1
   0 * X => 0
   1 * X => X
6. X * Y + Y => Y
   (X + Y) * Y => Y

In addition to the above syntactic simplifications, functional simplifications are made as well. For example, if NA is the inverse of A, NA could be replaced with ~A or A could be replaced with ~NA. Additionally, if BA is the inverse of NA, then BA and A are equivalent and can be interchanged (using the X op X→X rule, A+BA→A).

After determining logic equations for every logic signal 54 (both weak and non-weak equations), enough information has been asserted into the database such that a gate model netlist could be extracted. However, it is advantageous to additionally determine logic functions 62. The determination of logic functions 62 is an abstraction which greatly simplifies the extracted gate model.

It's easy to see that for simple complimentary CMOS logic, the 1- and 0- equations of a logic signal are equivalent and a gate can be derived from either signal's 1- or 0- equation. There are other cases where a gate model can be used for a signal, such as when abstracting a precharge model (described below). However, there are some cases when a gate transformation is more complex (i.e., when a logic signal is capable of storing a charge). In these cases, a simplified fet implementation is made. The simplified fet implementation comprises replacing the entire 0- equation with a gate or gates driving a single n-fet (pulldown fet), and replacing the entire 1- equation with a gate or gates driving a single p-fet (pullup fet).

The method performs several heuristics to determine whether the 1-equation, 0-equation, or both equations (simplified fet implementation) will be used in determining both weak and non-weak logic functions for a signal. The following rules may be either forward chaining or backward chaining.

Figure 36:
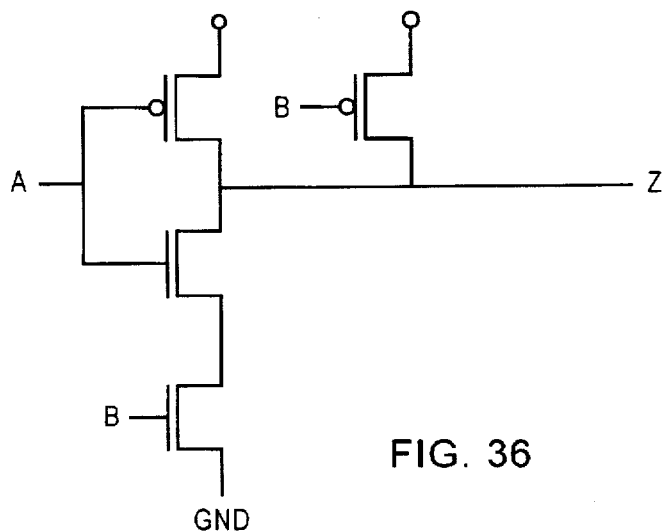
FIG. 36 is a schematic showing signal Z having identical 1- and 0- logic equations.

If the 1- and 0- equations are identical, then the 0-equation is used to determine logic function. Recall that 1-equations are kept in DeMorgan form so that a fully complementary gate will have matching 0- and 1- equations. Refer to FIG. 36, wherein the equations for signal Z are:

0-equation: A*B 1-equation: A*B

Figure 37:
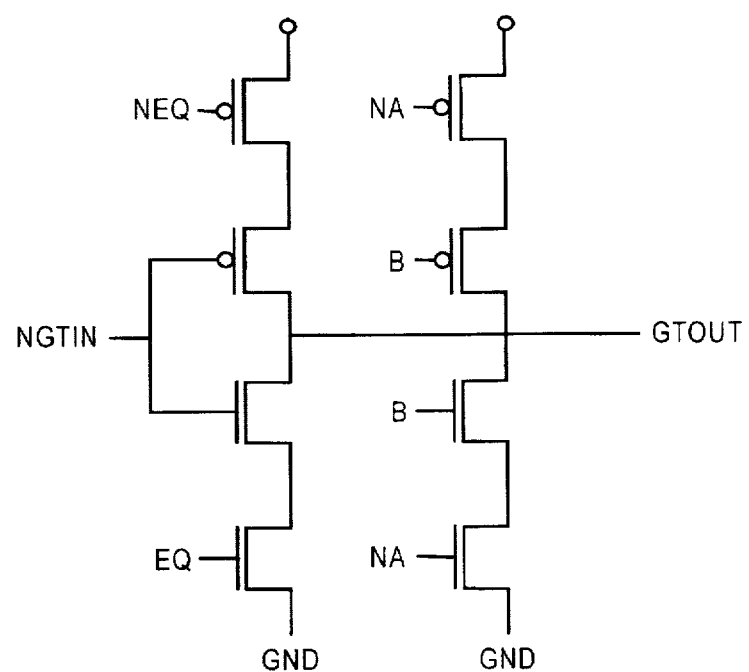
FIG. 37 is a schematic showing signal Z having identical rooted 1- and 0- logic equations.

If the rooted 1- and 0- equations are identical, then the 0-equation is used to determine logic function. A typical logic equation is defined in terms of other logic signals. However, a rooted equation is one that tries to expand its equation in terms of ports rather than other logic signals. For example, consider the following equations for signal GTOUT of FIG. 37:

0-equation: NGTIN * EQ+B * NA 1-equation: (NGTIN+NEQ) * (B+NA)

Even knowing that NA=~A, NB=~B, and NEQ=~EQ, it is not apparent that the two equations match. However, if the equations are expanded, and the logic for EQ is inserted (EQ=A * B+~A * ~B) into the equations, the above equations become:

rooted 0-logic: NGTIN * A * B +NGTIN * NA * NB+B * NA rooted 1-logic: NGTIN * B+NGTIN * NA+B * NA The rooted equations are identical and simplify to the same equation. A proof is not provided, but it is noted that with the term B * NA, the term NGTIN * A * B simplifies to NGTIN * B.

Figure 38:
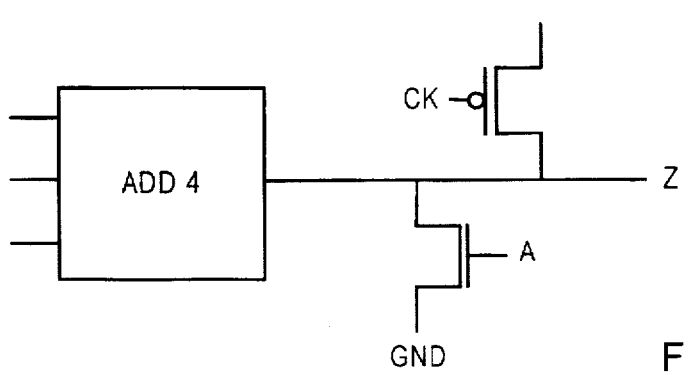
FIG. 38 is a schematic showing signal Z being driven by a non-fet instance.

If fets and non-fet instances are driving a logic signal, then a simplified fet implementation is made using both logic equations. A situation wherein this rule would be applicable is shown in FIG. 38, where signal Z may be driven by a non-fet instance, ADD4.

Figure 39:
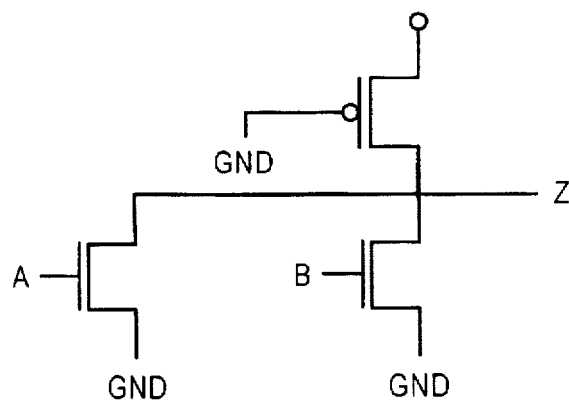
FIG. 39 is a schematic showing signal Z having a 1-logic equation which is a pullup fet.

If the 1-equation truly represents a pullup fet (as in NMOS design), then logic is abstracted, and the 0-equation is implemented as gates. A pullup fet is recognized as a weak p-fet that is always turned on (it has a grounded gate). In FIG. 39, the 1 equation for signal Z comprises a pullup fet, so the 0-equation, A*B, is implemented as a gate.

Figure 40:
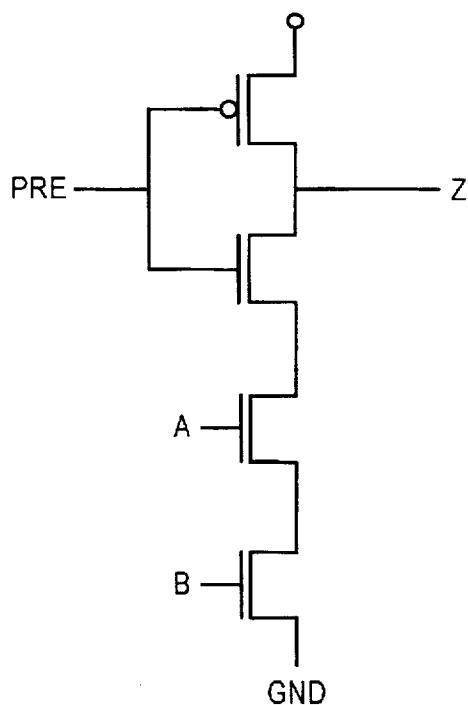
FIG. 40 is a schematic showing an Anded-Precharge circuit.

If the logic signal is an Anded-Precharge or Anded-Discharge case, it's not a port with clocked precharge/ discharge, and it's not a storage node (i.e. —a weak feedback inverter exists), then a gate is abstracted using the equation on the other side of the precharge/discharge (e.g., use the 0-equation in an Anded-Precharge case). An Anded-Precharge case is where the 0-equation is the same as the 1-equation but with extra terms ANDed in. For example, signal Z of the Anded-Precharge circuit of FIG. 40 has the equations:

1-equation: PRE 0-equation: A * B * PRE

The circuit would be abstracted as a NAND gate having inputs A, B and PRE, and output Z. This rule is prevented from firing if the logic signal is a port because leaf cell designers have been known to hook external fets to a signal which can affect its value. If the logic signal is part of a storage node, gates are not abstracted. Instead, the equations become part of the set/reset logic of a latch.

Figure 41:
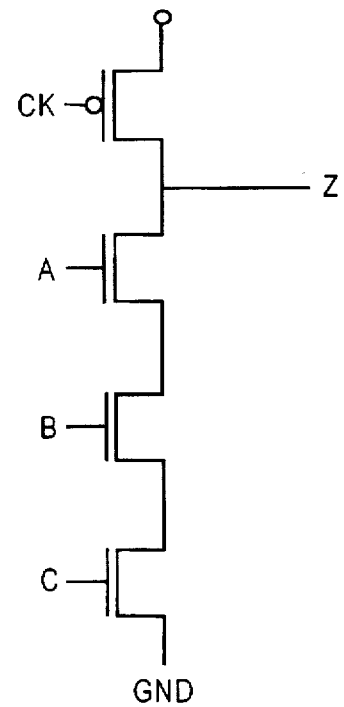
FIG. 41 is a schematic showing a Precharge circuit.

If the logic signal is a Precharge or Discharge case, it's not a port, and it's not a storage node (i.e. —a weak feedback inverter exists), then a gate is abstracted using the equation on the other side of the Precharge/Discharge (e.g., use the 0-equation in a Precharge case). This rule is similar to the Anded-Precharge/Anded-Discharge rule above, except that a Precharge/Discharge case requires the precharger/ discharger to be a clock signal, and no terms are required to be ANDed in on the other side. For example a Precharge case is shown in FIG. 41, in which the equations for signal Z are:

0-equation: A * B 1-equation: NCK

Figure 42:
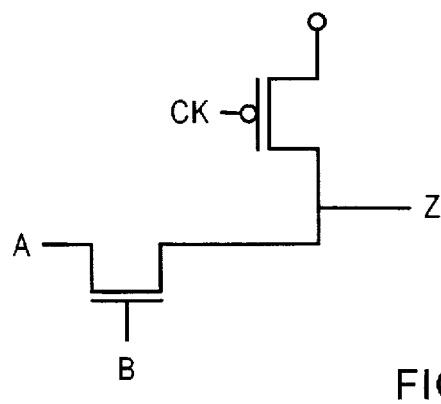
FIG. 42 is a schematic showing a clock precharger.

This rule also supports the case of a clock precharger along with a transfer fet from another logic signal. For example, consider FIG. 42, wherein CK is precharging Z, and signal B is gating a transfer n-fet from A to Z. This would be a Precharge case with the resultant implementation being a NAND gate (Z=¯(X *¯A)).

Figure 43:
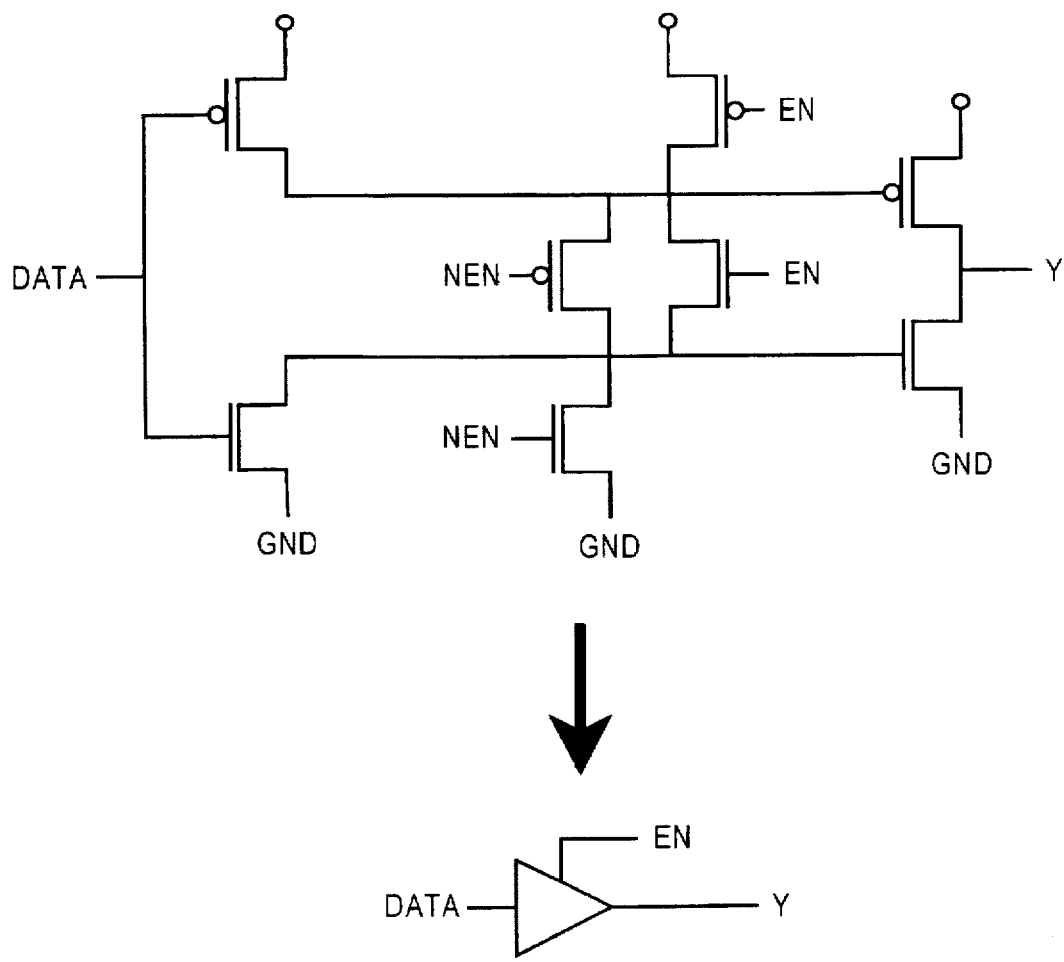
FIG. 43 shows the gate model corresponding to a fet modeled tristate driver.

If the logic signal is a tristate driver and is not a simple transfer fet, then a tristate gate implementation is used. A tristate driver is one in which the rooted equations for a logic signal are in the form:

rooted 0-equation: ¯DATA * EN rooted 1-equation: ¯DATA+¯EN (where En is an enable signal), as in FIG. 43.

Figure 44:
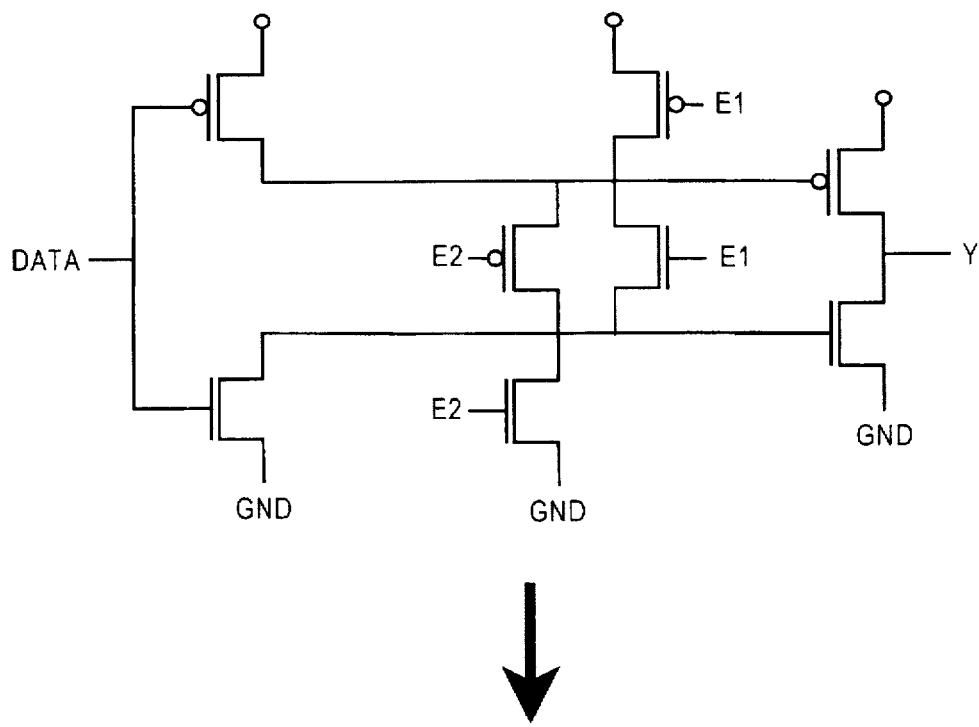
FIG. 44 shows the gate model corresponding to a fet modeled tristate CMOS driver.
Figure 44:
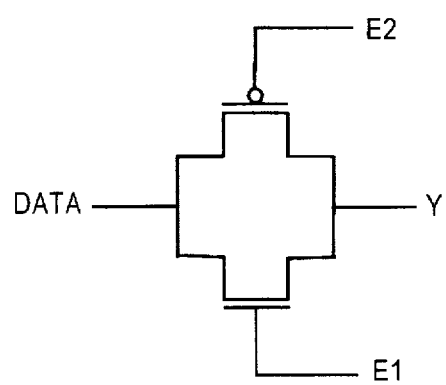

If the logic signal is a tristate CMOS driver (see FIG. 44), then a CMOS fet implementation is made. This rule is analagous to the tristate driver, but for the fact that the two enables (E1 and E2) don't need to be complements. To restrict false matching of the conditions of this rule, it is required that a logic signal be driven by a single pullup and pulldown fet.

Figure 45:
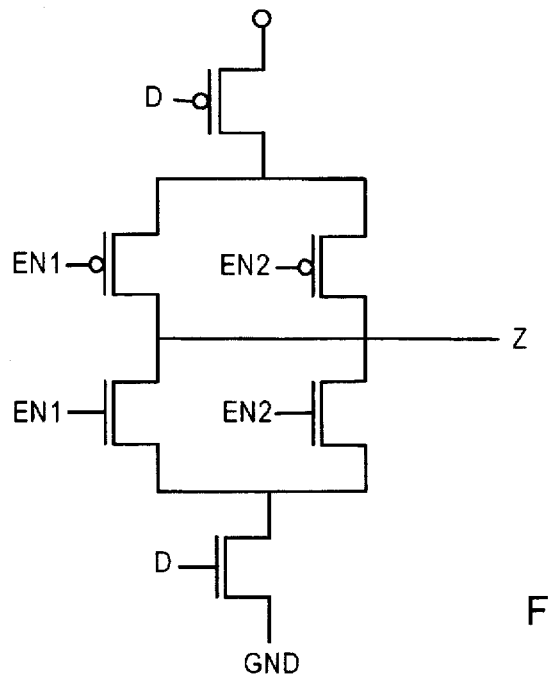
FIG. 45 is a schematic showing clocked logic.

If the logic signal is "clocked logic" and is not a tristate driver, then an implementation is made using a gate followed by a transfer fet. Clocked logic is where the 1- and 0- equations would be sound if all of the terms that are complemented in the other equation are removed. For example, the following equations of signal Z in FIG. 45 represent clocked logic:

0-equation: D * (EN1+EN2)

1-equation: D+(¯EN1* ¯EN2)

Figure 46:
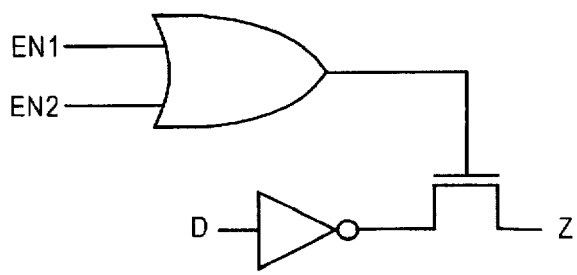
FIG. 46 is a gate model of the FIG. 45 clocked logic, as would be extracted by the method of FIGS. 1 or 2.

EN1 and EN2 are complemented between the 0-equation and the 1-equation, and the remaining equation (with all of the EN1 and EN2 terms removed) is trivially sound. Clocked logic is implemented as a transfer fet, gated by the removed "complement form" logic (the forms of EN1 and EN2 in the above example), and driven by the remaining sound logic (with the complement form removed). In the example of FIG. 45, the resultant implementation would be a transfer fet gated by (EN1+EN2 and driven by an inverter of D (FIG. 46).

If the logic signal is a single ended clocked logic case, it's a storage input node (i.e., an input to a latch), and the inputs are single-ended, then an appropriate implementation is a transfer fet from a logic gate implementing the clocked logic. Single ended clocked logic is where equations are of the form:

1-equation: A 0-equation: CK+A

Figure 47:
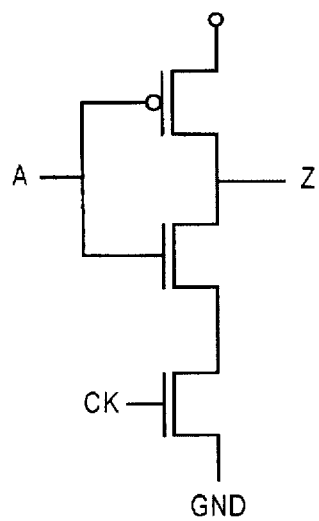
FIG. 47 is a schematic showing single ended clocked logic.
Figure 48:
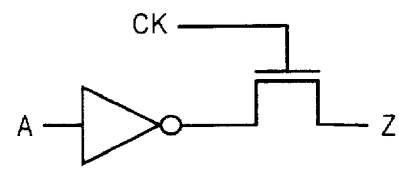
FIG. 48 is a gate model of the FIG. 47 schematic, as would be extracted by the method of FIGS. 1 or 2.

Signal Z of FIG. 47 is derived from these equations. Both equations are the same but for a series clock term on one side (an analagous situation exists if the clock term is in the 1-equation). The logic signal is implemented with a gate or gates generating A (an inverter if A is just a single signal), followed by a transfer fet gated by CK into the storage node. The implementation for FIG. 47 is shown in FIG. 48. The inputs are required to be single-ended or this rule will not fire. Single-ended means that the inputs are guaranteed to go "inactive" while the clock term is off so that the whole signal is off (both sides). Note that while the clock term is on, the implementation is nothing more than a complementary logic gate.

Figure 49:
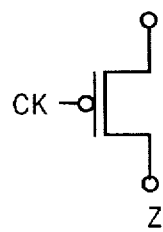
FIG. 49 is a schematic showing an implied storage node.

If a logic signal is an implied storage node, it is implemented as fets. An implied storage node is a port that isn't a storage input node (i.e., not a defined latch such as cross-coupled inverters), only has one equation (the other side has no fet tree), and the one equation is a clock. Signal Z of FIG. 49, having the sole 1-equation of CK, is an example of an implied storage node.

Figure 50:
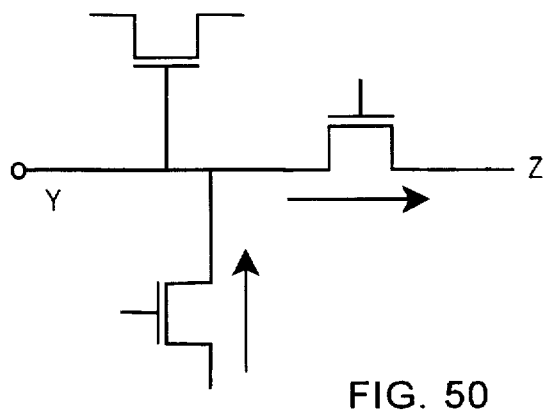
FIG. 50 is a schematic showing signal Z having a transfer gate from a known tristateable port.

If a logic signal is not a storage input node, but has a transfer gate from a port that is known to be tristateable, then it is implemented with fets. The primary instance of a tristateable port is when it's an input or bidirectional port, and there is a fet known to be driving it (taken from the fet directions in the database). Logic signal Z of FIG. 50 meets the requirements of this rule, as signal Y is determined to e a tristateable driver. In this case (and in the absence of other applicable rules on logic functions), it is preferred to implement the transfer gate to the logic signal as fets so that the signal may tristate.

Figure 51:
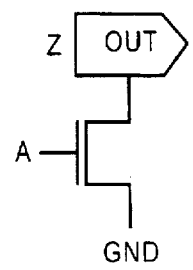
FIG. 51 is a schematic showing a port connected to fets pulling it to only one rail.

If the logic signal is a port, there are fets pulling to only one rail, and the port is either strictly an output or is bidirectional with no other possible receivers, then a fet implementation is made. See FIG. 51 for a case which would cause firing of this rule. If the port is bidirectional with receivers, a user may be prompted to see if fets are needed at all.

Figure 52:
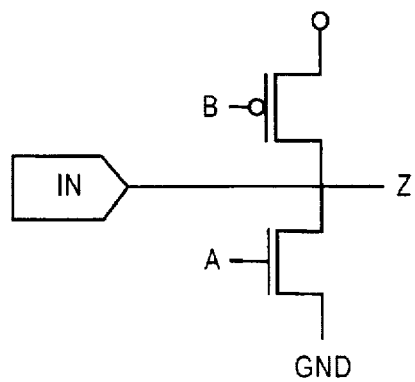
FIG. 52 is a schematic showing a logic signal, Z, which is not a storage node, having 1- and 0- logic equations.

If the logic signal is an input or bidirectional port with logic equations for both sides, and it's not a storage node, then a fet implementation is made. This rule prevents gates being used to drive against an input port (which causes problems with some test equipment). In FIG. 52, this rule would prevent gates A and B from driving against input port IN.

Figure 53:
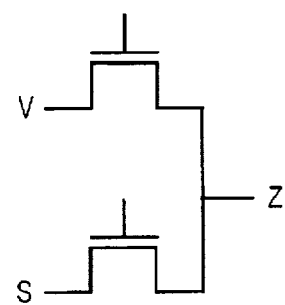
FIG. 53 is a schematic showing logic signal Z connected only to transfer fets.

If a logic signal is only connected to transfer fets from other logic signals, and it isn't a storage node, a fet implementation is made. This is the most natural way to represent transfer functions such as the one shown for signal Z of FIG. 53.

Figure 54:
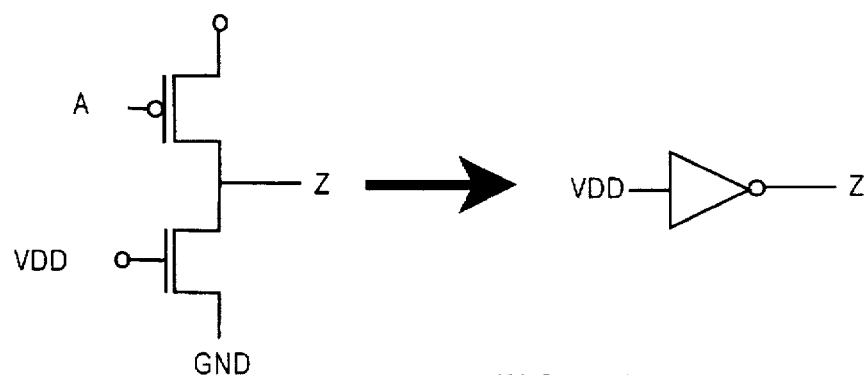
FIG. 54 shows the gate model extracted by the method of FIGS. 1 or 2 for a logic signal having a "hot" side.

If the equation for one side of a logic signal is either 1 or 0, and the other equation isn't the opposite (indicating a drive fight), a gate implementation (e.g., buffer) is made using the equation that is always 1 (the "hot" side). FIG. 54 shows the implementation of signal Z being an inversion of VDD. The 0-equation of signal Z is always "hot" due to the fet having a gate tied to VDD.

Figure 55:
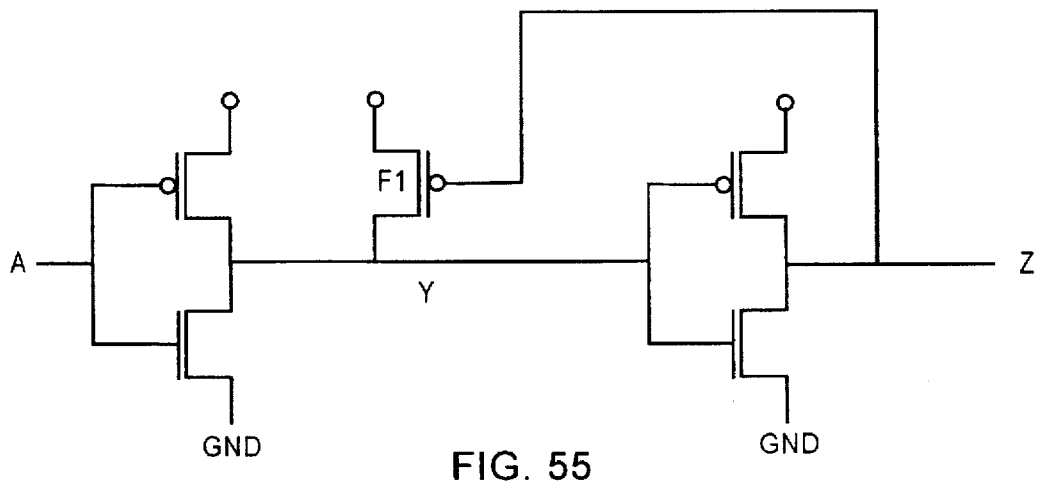
FIG. 55 is a schematic showing a weak feedback fet, F1.

If weak feedback exists for a logic signal having a gate implementation (due to an implementation from one of the above rules), then the weak feedback is discarded from the gate model netlist. Fet F1 of FIG. 55, recognized by the method as being weak, would be discarded from the implementation. This rule discards feedback which exists solely for electrical reasons.

Figure 56:
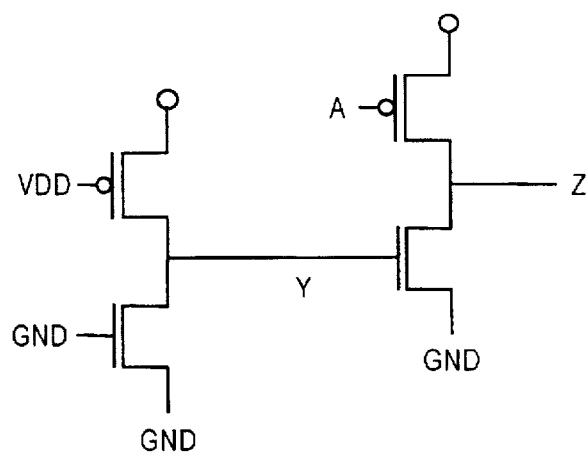
FIG. 56 is a schematic showing signal Z, for which a rooted 1-logic equation cannot be derived.

If a rooted equation cannot be generated for one side of a logic signal, that side is discarded and a logic function is not generated for that side. The 0-equation of signal Z in FIG. 56 is discarded since there is no way to bring Y to a logic one. If a standard equation exists for a logic signal, but a rooted equation could not be generated, a logical inconsistency has been found (such as A * ~A).

Figure 57:
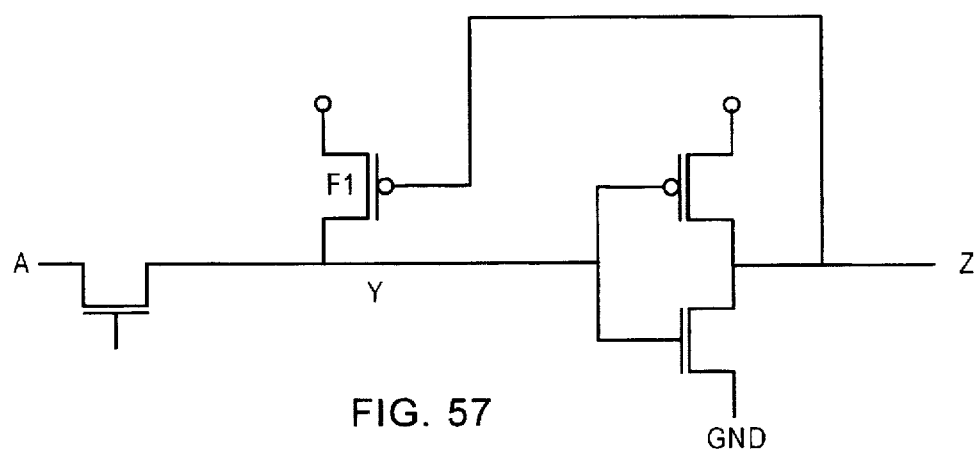
FIG. 57 is a schematic showing another weak feedback fet, F1.

If weak feedback comprises a single let on only one side of an inverter, the weak feedback is ignored (discarded). F1, a weak feedback inverter, is ignored in the implementation of FIG. 57. The weak feedback exists solely for electrical purposes (e.g., "propping up" a signal).

Figure 58:
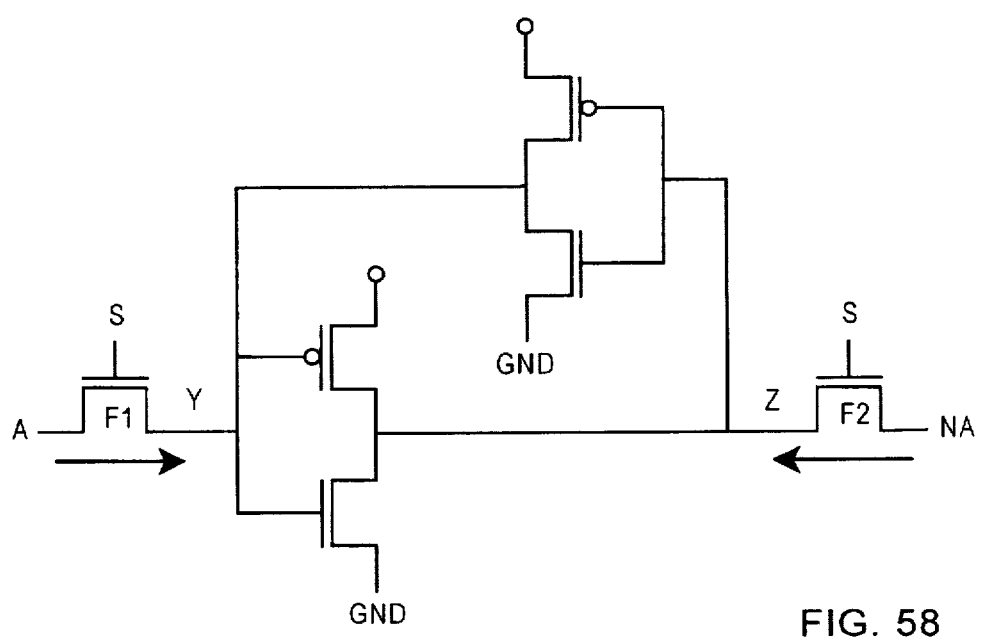
FIG. 58 is a schematic showing a storage node set by fet logic at its front and rear.

If a storage node (such as cross-coupled inverters) is set by fet logic on both the front and rear (it's set at the inputs of both inverters, as in fets F1 and F2 in the storage node of FIG. 58), and one of the setting equations subsumes the other, then the subsumed equation is discarded.

If the logic signal is a storage node and weak feedback hasn't been ignored, then a fet implementation indicating a set/reset latch is made.

If the above logic function rules are unable to implement a logic signal, a user is prompted. The user may be given the options of 1) selecting either the 1- or 0-equation for implementation, thereby causing a gate implementation, 2) selecting a fet implementation, or 3) discarding the equations and dispensing with implementation of a logic function altogether. These options are given in conjunction with both weak and non-weak logic signals.

Properties may be added to the input netlist to override the rule implementations noted above (as is the case with all rules in this method).

Once logic functions have been determined 62, and the type of implementation to be used for each logic signal is known, logic functions are mapped as gates 64.

For each logic signal that uses only a 1- or 0-equation to determine its function, gates may be mapped directly, keeping in mind that there is an implied inversion of the gate output. For example, an implementation using the 0-equation Z=A * B will generate a NAND gate with inputs A and B. Gates implemented from weak equations are marked as such (including strength designations in the output netlist).

Figure 59:
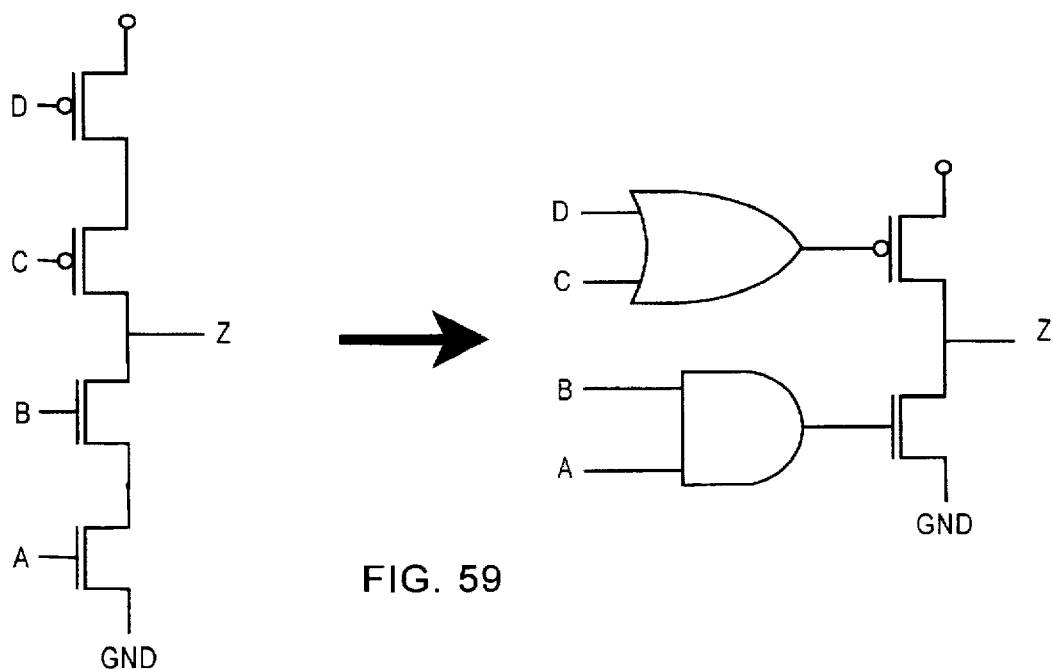
FIG. 59 shows the gate model generated for a signal, Z, implemented using fets for both its 1- and 0- logic equations.

For each logic signal that is implemented using fets, the 1- and 0- equations are respectively replaced with a p-fet and an n-fet. Gates are then generated from the equations to drive each of the fet's gate signals. In the case of transfer fets, the equations for each logic signal from which a transfer fet comes is isolated, and implemented separately. An exemplary transformation which would be made using this rule is indicated in FIG. 59, in which signal Z is implemented with gates driving a p-fet and an n-fet.

Having mapped (implemented) logic functions as gates, gates are optimized using the following rules.

A gate implementation of (A * ~B) +(~A * B) is recognized as an XOR gate and replaced by such.

Figure 60:
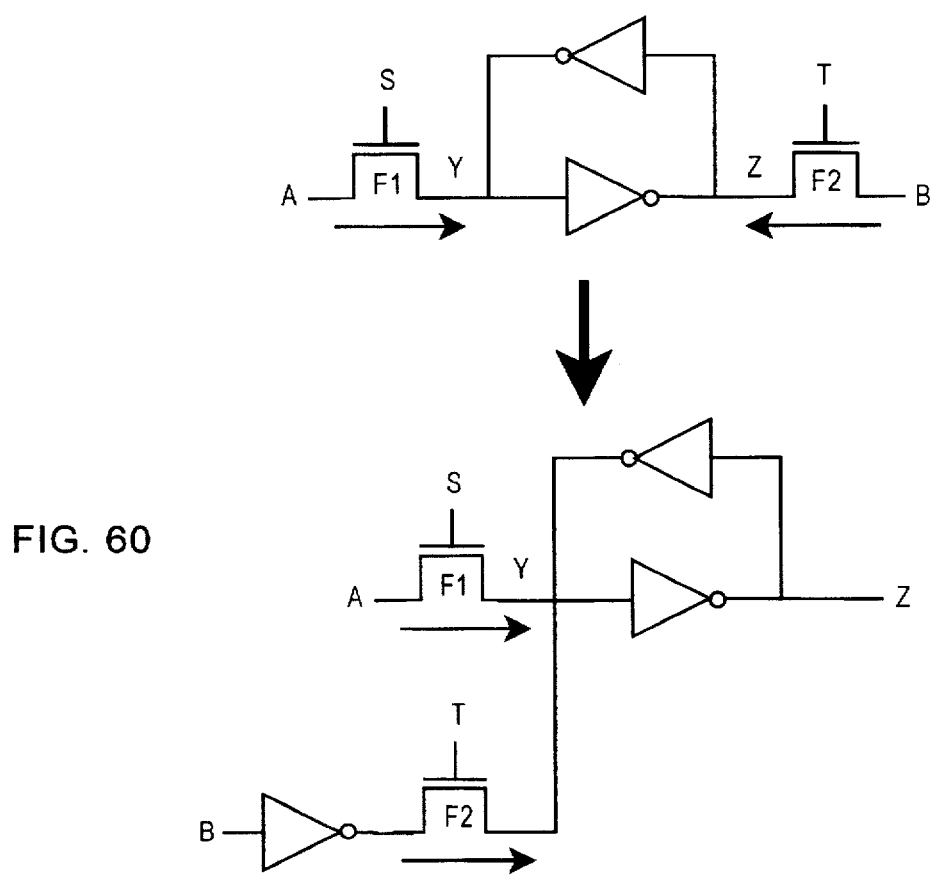
FIG. 60 shows a first gate optimization process.

If fets drive both ends of a latch (i.e., there are fets driving both ends of the feedback inverters), then an attempt is made ad moving a fet from one end to the other by inverting the signal from which it comes. The restrictions on doing this are 1) the weak feedback gate whose driving fet is considered being moved must either be an inverter, or not have its output be received by any other gate outside of the feedback group (otherwise, its function could be corrupted by moving it), and 2) the fet trees driving the ends of the latch cannot be bidirectional (as would often be the case in a RAM cell). If moving a fet creates a redundancy in a fet tree driving the end of a latch, it is removed. An exemplary optimization performed using this rule is shown in FIG. 60. Note the move of fet F2.

A chain of inverters is collapsed to one inverter if the chain is of odd length. A chain of inverters is collapsed to a buffer if the chain is of even length.

If inverters drive all of the inputs to a simple logic gate, then the gate and inverters are replaced by their logic "dual" using the inverted sense of all inputs. For example, if all of the inputs to a NOR gate are inverted, then the NOR gate and inverters are replaced by an AND gate using the inverted inputs (FIG. 61). The restriction to using this rule is that no input can be involved with feedback through the gate.

Buffers are deleted, provided that one of the following is true (which causes the buffer to be retained in the presence of possible tristateable nodes on both sides): 1) the output is not a port, is not received by fets, and is not a storage node, or 2) the input is not a port, is not received by fets, and is not a storage node.

A gate and a following inverter (with no other gate receiving the intermediate signal) are replaced by a complement gate. For example, a NAND gate followed by an inverter (NOT gate) is replaced by an AND gate.

Any gates which are left unused after gate optimization are removed from the output netlist.

It is useful to add a number of properties to the instances and signals of the output netlist. Properties may include an identification of weak gates, storage nodes, assumptions concerning signals such as complementary inputs (the N<sig>convention discussed above), precharging, etc.

The gates implemented above (gate primitives) may be mapped to other gate primitives 66 by one skilled in the art.

The conservative nature of the above disclosed method results in the extraction of a gate model (or output netlist) which is extremely accurate. Although fet and port directions can usually be inferred, if they cannot, their direction is requested from a user. The method is designed to infer facts, not make bold assumptions.

Figure 62:
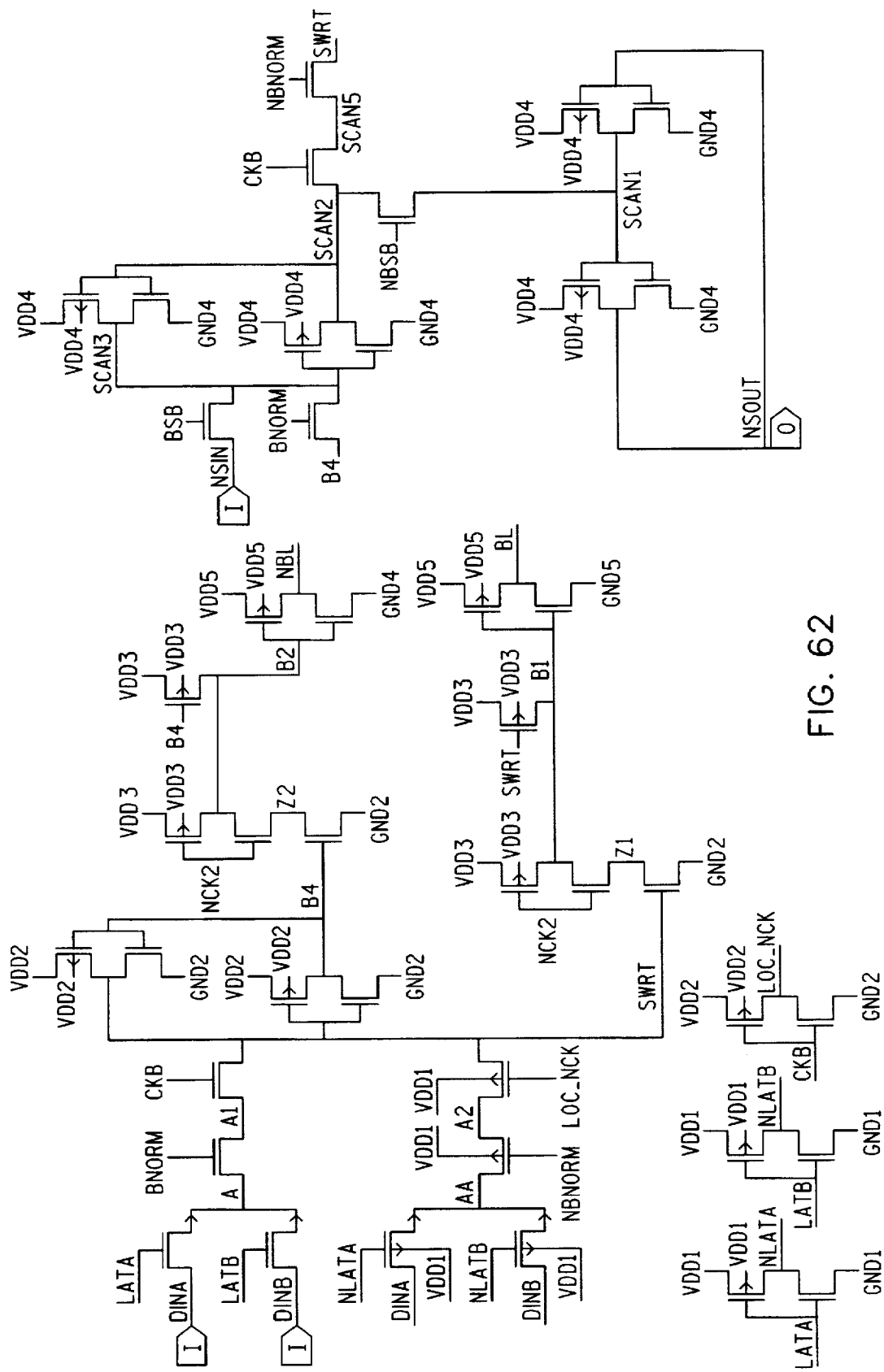
FIG. 62 is a schematic of a fet modeled circuit.
Figure 63:
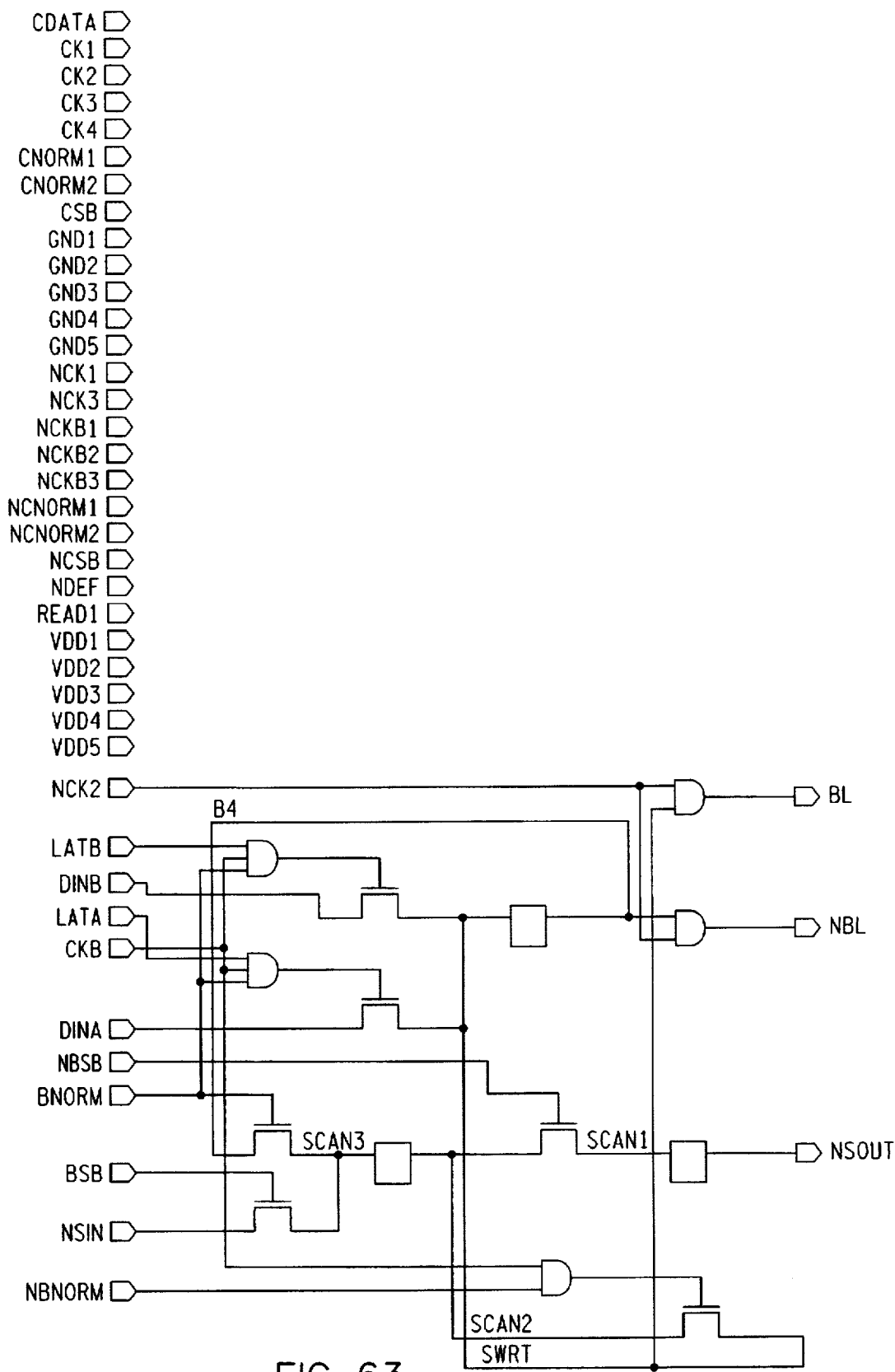
FIG. 63 is a gate modeled circuit corresponding to the fet modeled circuit of FIG. 62, as extracted by the method of FIGS. 1 or 2.

A fet model, and the gate model extracted from it using the method described above, are shown in FIGS. 62 and 63, respectively.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A computer implemented method of extracting a gate modeled circuit from a fet modeled circuit, comprising the steps of:
   a) recognizing power, ground and clock signals of the fet modeled circuit;
   b) recognizing inverters of the fet modeled circuit;
   c) recognizing and preserving all logic signals of the fet modeled circuit;
   d) building one or more structurally based boolean partial trees, wherein,
      i) each partial tree is rooted in a preserved logic signal;
      ii) a partial tree is built by,
         A) identifying a fet connected to a preserved logic signal by a source or drain connection as a trunk of the partial tree;
         B) adding to the trunk as branches any fets connected to it via a string of source and/or drain connections; and
         C) terminating a branch of the partial tree if a preserved logic signal, power signal, or ground signal is encountered; and
      ii) the partial trees comprise:
         A) 0-trees, representing fets which can drive a logic signal low; and
         B) 1-trees, representing fets which can drive a logic signal high;
   e) heuristically pruning the one or more partial trees, wherein pruning is complete when fet and port directions are known for all fets and ports represented by the partial trees; and
   f) building logic equations from the one or more boolean partial trees.

2. A method as in claim 1, further comprising the step of inferring an initial fet direction for each fet, prior to building the one or more boolean partial trees, wherein initial fet directions are determined by traversing source and drain connections, beginning with a power or ground signal, and continuing so long as the driven ends of fets are connected to only one other fet, and no port, fet gate, or non-fet instance is encountered.

3. A method as in claim 2, further comprising the step of removing redundant fets prior to building the one or more structurally based boolean partial trees.

4. A method as in claim 2, further comprising the steps of:
   a) computing a maximum strength for each partial tree, wherein the maximum strength corresponds to a resistance of a least resistant series branch path of a partial tree; and
   b) partitioning weak partial trees from non-weak partial trees, prior to building logic equations from the one or more boolean partial trees, by recognizing feedback trees, wherein feedback trees are two cross-coupled partial trees, each having the other's root as an input.

5. A method as in claim 4, further comprising the steps of, for each preserved logic signal:
   a) merging its weak 1-trees;
   b) merging its weak 0-trees;
   c) merging its non-weak 1-trees; and
   d) merging its non-weak 0-trees;
   thereby creating up to four structurally based boolean trees for each preserved logic signal;
   wherein the step of building logic equations from the one or more structurally based boolean partial trees comprises building a logic equation for each structurally based boolean tree.

6. A method as in claim 5, further comprising the step of executing a parallel recombination of partial tree sub-trees, prior to building logic equations, by combining tree structures above a duplicated node of a partial tree.

7. A method as in claim 6, further comprising the step of determining a logic function for weak and non-weak subsets of partial trees rooted in a common logic signal.

8. A method as in claim 9, further comprising the step of mapping logic functions to corresponding gate primitives.

9. A method as in claim 2, further comprising the step of pruning, as partial trees are built, any partial tree branches driven by fets with conflicting gate signals.

10. A method as in claim 1, wherein the step of heuristically pruning the one or more boolean partial trees comprises the steps of:
    a) resolving port directions of ports represented by the partial trees;
    b) resolving fet directions of fets represented by the partial trees; and
    c) prompting a user to supply a port or fet direction when same cannot be resolved.

11. A method as in claim 1, further comprising the steps of:
    a) computing a maximum strength for each partial tree, wherein the maximum strength corresponds to a resistance of a least resistant series branch path of a partial tree; and
    b) partitioning weak partial trees from non-weak partial trees, prior to building logic equations from the one or more boolean partial trees, by recognizing feedback trees, wherein feedback trees are two cross-coupled partial trees, each having the other's root as an input.

12. A method as in claim 11, wherein the step of partitioning week partial trees from non-weak partial trees comprises the steps of:
    a) designating a first partial tree involved with feedback as weak if a second partial tree is stronger, is capable of pulling the root of the first partial tree in an opposite direction, and is not disjoint from the first partial tree;
    b) designating a first partial tree involved with feedback as weak if a second partial tree capable of pulling the root of the first partial tree in an opposite direction does not exist, and the root of the first partial tree is a port, or driven by a non-fet instance;
    c) designating a partial tree involved with feedback as weak if it is a transfer tree, and the transfer signal is a feedback signal which can be driven in a direction opposite to that of the first partial tree; and
    d) designating a first partial tree involved with feedback as weak if a second partial tree capable of pulling the root of the first partial tree in an opposite direction exists, and the first partial tree's inputs are a subset of the second partial tree's inputs.

13. A method as in claim 11, further comprising the steps of, for each preserved logic signal:
    a) merging its weak 1-trees;
    b) merging its weak 0-trees;
    c) merging its non-weak 1-trees; and
    d) merging its non-weak 0-trees;
    thereby creating up to four structurally based boolean trees for each preserved logic signal;
    wherein the step of building logic equations from the one or more structurally based boolean partial trees comprises building a logic equation for each structurally based boolean tree.

14. A method as in claim 13, further comprising the step of executing a parallel recombination of partial tree sub-trees, prior to building logic equations, by combining tree structures above a duplicated node of a partial tree.

15. A method as in claim 1, further comprising the step of executing a parallel recombination of partial tree sub-trees, prior to building logic equations, by combining tree structures above a duplicated node of a partial tree.

16. A method as in claim 15, further comprising the step of renaming nodes duplicated within a partial tree so that branches under the duplicated nodes are not pruned in a later attempt at parallel recombination.

17. A method as in claim 1, wherein logic equations for either the 1-trees or 0-trees are built in DeMorgan form so as to simplify detection of sound logic.

18. A method as in claim 1, further comprising the step of determining a logic function weak and non-weak subsets of partial trees rooted in a common logic signal.

19. A method as in claim 10, wherein no more than a predetermined computational effort is exerted in attempt to resolve a port and/or fet direction before a user is prompted to supply the port and/or fet direction.

20. Expert system apparatus for converting a fet modeled circuit into a gate modeled circuit, comprising:
 a) a fet modeled circuit input;
 b) an inference engine, receiving said fet modeled circuit input;
 c) a knowledge base, accessible to said inference engine, comprising:
  i) at least one heuristic tree pruning rule base;
  ii) at least one port direction rule base; and
  iii) at least one fet direction rule base;
 d) a user interface, interconnected with said inference engine; and
 e) a gate modeled circuit output, generated by said inference engine.

* * * * *